United States Patent
Clarke et al.

(10) Patent No.: US 10,199,482 B2
(45) Date of Patent: Feb. 5, 2019

(54) APPARATUS FOR ELECTROSTATIC DISCHARGE PROTECTION

(75) Inventors: David Clarke, Patrickswell (IE); Paul Daly, New Castle (IE); Patrick McGuinness, Pallaskenry (IE); Bernard Stenson, County Limerick (IE); Anne Deignan, Manister (IE)

(73) Assignee: ANALOG DEVICES, INC., Norwood, MA (US)

( * ) Notice: Subject to any disclaimer, the term of this patent is extended or adjusted under 35 U.S.C. 154(b) by 123 days.

(21) Appl. No.: 12/955,638

(22) Filed: Nov. 29, 2010

(65) Prior Publication Data
US 2012/0133025 A1     May 31, 2012

(51) Int. Cl.
| H01L 23/60 | (2006.01) |
| H01L 29/735 | (2006.01) |
| H01L 27/02 | (2006.01) |

(52) U.S. Cl.
CPC ............ *H01L 29/735* (2013.01); *H01L 23/60* (2013.01); *H01L 27/0259* (2013.01)

(58) Field of Classification Search
CPC ..... H01L 23/60; H01L 27/0248; H01L 29/76; H01L 26/76
USPC .......................................... 257/570; 438/197
See application file for complete search history.

(56) References Cited

U.S. PATENT DOCUMENTS

| 3,436,667 A | 4/1969 | Kedson |
| 3,660,687 A | 5/1972 | Sahm et al. |
| 3,694,670 A | 9/1972 | Marzolf |
| 3,764,864 A | 10/1973 | Okumura et al. |
| 4,260,910 A | 4/1981 | Colman |

(Continued)

FOREIGN PATENT DOCUMENTS

| EP | 0 168 678 A2 | 1/1986 |
| EP | 0 234 269 | 9/1987 |

(Continued)

OTHER PUBLICATIONS

Partial International Search Report dated Dec. 8, 2010 for International application PCT/US2010/051356.

(Continued)

*Primary Examiner* — Thao X Le
*Assistant Examiner* — Geoffrey Ida
(74) *Attorney, Agent, or Firm* — Knobbe Martens Olson & Bear LLP

(57) ABSTRACT

An apparatus includes an electrostatic discharge (ESD) protection device configured to protect a circuit from ESD conditions. The protection device includes an emitter region having a first diffusion polarity; a collector region laterally spaced apart from the emitter region, and having the first diffusion polarity; and a barrier region interposed laterally between the emitter region and the collector region while contacting the emitter region. The barrier region has a second diffusion polarity opposite from the first diffusion polarity. The device can further include a base region having the second diffusion polarity, and laterally surrounding and underlying the emitter region and the barrier region. The barrier region can have a higher dopant concentration than the base region, and block a lateral current flow between the collector and emitter regions, thus forming a vertical ESD device having enhanced ESD performance.

26 Claims, 17 Drawing Sheets

(56) References Cited

U.S. PATENT DOCUMENTS

| | | |
|---|---|---|
| 4,476,480 A | 10/1984 | Fuse |
| 4,520,277 A | 5/1985 | Hahn |
| 4,528,461 A | 7/1985 | Shackle et al. |
| 4,633,283 A | 12/1986 | Avery |
| 4,992,844 A | 2/1991 | Yakushiji |
| 5,061,652 A | 10/1991 | Bendernagel et al. |
| 5,081,517 A | 1/1992 | Contiero et al. |
| 5,091,763 A | 2/1992 | Sanchez |
| 5,212,106 A | 5/1993 | Erb et al. |
| 5,212,618 A | 5/1993 | O'Neill et al. |
| 5,235,201 A | 8/1993 | Honna |
| 5,276,582 A | 1/1994 | Merrill et al. |
| 5,341,005 A | 8/1994 | Canclini |
| 5,343,053 A | 8/1994 | Avery |
| 5,371,401 A | 12/1994 | Kurita |
| 5,432,366 A | 7/1995 | Banerjee et al. |
| 5,436,486 A | 7/1995 | Fujishima et al. |
| 5,440,151 A | 8/1995 | Crevel et al. |
| 5,440,162 A | 8/1995 | Worley |
| 5,473,169 A | 12/1995 | Ker et al. |
| 5,485,023 A | 1/1996 | Sumida |
| 5,541,801 A | 7/1996 | Lee et al. |
| 5,576,557 A | 11/1996 | Ker et al. |
| 5,576,574 A | 11/1996 | Hong |
| 5,594,266 A | 1/1997 | Beigel et al. |
| 5,602,409 A | 2/1997 | Olney |
| 5,610,425 A | 3/1997 | Quigley et al. |
| 5,615,074 A | 3/1997 | Avery |
| 5,637,892 A | 6/1997 | Leach |
| 5,637,901 A | 6/1997 | Beigel et al. |
| 5,652,689 A | 7/1997 | Yuan |
| 5,663,860 A | 9/1997 | Swonger |
| 5,668,024 A | 9/1997 | Tsai et al. |
| 5,719,432 A | 2/1998 | Kariyazono et al. |
| 5,736,769 A | 4/1998 | Nishiura et al. |
| 5,742,084 A | 4/1998 | Yu |
| 5,745,323 A | 4/1998 | English et al. |
| 5,757,045 A | 5/1998 | Tsai et al. |
| 5,781,389 A | 7/1998 | Fukuzako et al. |
| 5,786,617 A | 7/1998 | Merrill et al. |
| 5,818,088 A | 10/1998 | Ellis |
| 5,832,376 A | 11/1998 | Henderson et al. |
| 5,862,301 A | 1/1999 | Gontowski, Jr. |
| 5,889,644 A | 3/1999 | Schoenfeld et al. |
| 5,892,264 A | 4/1999 | Kintz et al. |
| 5,895,940 A | 4/1999 | Kim |
| 5,912,490 A | 6/1999 | Hebert et al. |
| 5,949,094 A | 9/1999 | Amerasekera |
| 5,973,341 A | 12/1999 | Letavic et al. |
| 5,998,813 A | 12/1999 | Bernier |
| 6,084,269 A | 7/2000 | Davies et al. |
| 6,097,068 A | 8/2000 | Brown et al. |
| 6,137,140 A | 10/2000 | Efland et al. |
| 6,144,542 A | 11/2000 | Ker et al. |
| 6,159,814 A | 12/2000 | Gardner et al. |
| 6,236,087 B1 | 5/2001 | Daly et al. |
| 6,248,652 B1 | 6/2001 | Kokubun |
| 6,258,634 B1 | 7/2001 | Wang et al. |
| 6,310,379 B1 | 10/2001 | Andresen et al. |
| 6,329,694 B1 | 12/2001 | Lee et al. |
| 6,365,475 B1 | 4/2002 | Cheng et al. |
| 6,403,992 B1 | 6/2002 | Wei |
| 6,404,261 B1 | 6/2002 | Grover et al. |
| 6,423,987 B1 | 7/2002 | Constapel et al. |
| 6,462,360 B1 | 10/2002 | Higgins, Jr. et al. |
| 6,501,632 B1 | 12/2002 | Avery et al. |
| 6,512,662 B1 | 1/2003 | Wang |
| 6,590,273 B2 | 7/2003 | Okawa et al. |
| 6,621,126 B2 | 9/2003 | Russ |
| 6,665,160 B2 | 12/2003 | Lin et al. |
| 6,667,870 B1 | 12/2003 | Segervall |
| 6,690,557 B2 | 2/2004 | Hung et al. |
| 6,704,180 B2 | 3/2004 | Tyler et al. |
| 6,707,118 B2 | 3/2004 | Muljono et al. |
| 6,713,816 B1 | 3/2004 | Wolf et al. |
| 6,724,603 B2 | 4/2004 | Miller et al. |
| 6,756,834 B1 | 6/2004 | Tong et al. |
| 6,765,771 B2 | 7/2004 | Ker et al. |
| 6,768,616 B2 | 7/2004 | Mergens et al. |
| 6,870,202 B2 | 3/2005 | Oka |
| 6,882,009 B2 | 4/2005 | Ker et al. |
| 6,927,957 B1 | 8/2005 | Bakulin et al. |
| 6,960,792 B1 | 11/2005 | Nguyen |
| 6,960,811 B2 | 11/2005 | Wu et al. |
| 6,979,869 B2 | 12/2005 | Chen et al. |
| 7,034,363 B2 | 4/2006 | Chen |
| 7,038,280 B2 | 5/2006 | Righter |
| 7,071,528 B2 | 7/2006 | Ker et al. |
| 7,125,760 B1 | 10/2006 | Reese et al. |
| 7,232,705 B2 | 6/2007 | Righter |
| 7,232,711 B2 | 6/2007 | Gambino et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,471,493 B1 | 12/2008 | Huang et al. |
| 7,479,672 B2 | 1/2009 | Zhao |
| 7,538,998 B2 | 5/2009 | Tsai et al. |
| 7,566,914 B2 | 7/2009 | Salcedo et al. |
| 7,570,467 B2 | 8/2009 | Watanabe et al. |
| 7,601,991 B2 | 10/2009 | Salcedo et al. |
| 7,663,190 B2 | 2/2010 | Vinson |
| 7,714,357 B2 | 5/2010 | Hayashi et al. |
| 7,834,378 B2 | 11/2010 | Ryu et al. |
| 7,859,082 B2 | 12/2010 | Stecher |
| 7,910,999 B2 | 3/2011 | Lee et al. |
| 7,969,006 B2 | 6/2011 | Lin et al. |
| 8,044,457 B2 | 10/2011 | Salcedo et al. |
| 8,198,651 B2 | 6/2012 | Langguth et al. |
| 8,222,698 B2 | 7/2012 | Salcedo et al. |
| 8,278,684 B1 * | 10/2012 | Walker et al. ............ 257/173 |
| 8,331,069 B2 | 12/2012 | Galy et al. |
| 8,368,116 B2 | 2/2013 | Salcedo et al. |
| 8,416,543 B2 | 4/2013 | Salcedo et al. |
| 8,432,651 B2 | 4/2013 | Salcedo et al. |
| 8,462,477 B2 | 6/2013 | Modica et al. |
| 8,466,489 B2 | 6/2013 | Salcedo et al. |
| 8,476,684 B2 | 7/2013 | Coyne et al. |
| 8,553,380 B2 | 10/2013 | Salcedo |
| 8,592,860 B2 | 11/2013 | Salcedo et al. |
| 8,610,251 B1 | 12/2013 | Salcedo |
| 8,633,509 B2 | 1/2014 | Salcedo |
| 8,637,899 B2 | 1/2014 | Salcedo |
| 8,665,571 B2 | 3/2014 | Salcedo et al. |
| 8,680,620 B2 | 3/2014 | Salcedo et al. |
| 8,772,091 B2 | 7/2014 | Salcedo et al. |
| 8,796,729 B2 | 8/2014 | Clarke et al. |
| 8,829,570 B2 | 9/2014 | Parthasarathy et al. |
| 8,860,080 B2 | 10/2014 | Salcedo |
| 8,946,822 B2 | 2/2015 | Salcedo et al. |
| 8,947,841 B2 | 2/2015 | Salcedo et al. |
| 9,520,486 B2 | 12/2016 | Coyne et al. |
| 2001/0031521 A1 * | 10/2001 | Pan et al. .............. 438/197 |
| 2001/0040254 A1 | 11/2001 | Takiguchi |
| 2001/0050374 A1 * | 12/2001 | Yoshitake ......... H01L 29/861 |
| | | 257/104 |
| 2002/0021538 A1 | 2/2002 | Chen et al. |
| 2002/0033520 A1 * | 3/2002 | Kunikiyo .................. 257/577 |
| 2002/0074604 A1 | 6/2002 | Wang et al. |
| 2002/0081783 A1 | 6/2002 | Lee et al. |
| 2002/0109190 A1 | 8/2002 | Ker et al. |
| 2002/0122280 A1 | 9/2002 | Ker et al. |
| 2002/0125931 A1 | 9/2002 | Yue et al. |
| 2002/0140050 A1 | 10/2002 | Bohlin et al. |
| 2002/0153564 A1 * | 10/2002 | Shirai ..................... 257/347 |
| 2003/0038298 A1 | 2/2003 | Cheng et al. |
| 2003/0076636 A1 | 4/2003 | Ker et al. |
| 2003/0116785 A1 | 6/2003 | D'Anna et al. |
| 2003/0147190 A1 | 8/2003 | Ker et al. |
| 2003/0168701 A1 * | 9/2003 | Voldman .................. 257/355 |
| 2003/0209758 A1 | 11/2003 | Lee et al. |
| 2004/0027745 A1 * | 2/2004 | Kunz et al. ............... 361/56 |
| 2004/0048428 A1 | 3/2004 | Tanomura |
| 2004/0135229 A1 | 7/2004 | Sasahara |

(56) References Cited

U.S. PATENT DOCUMENTS

| | | |
|---|---|---|
| 2004/0164354 A1 | 8/2004 | Mergens et al. |
| 2004/0190208 A1 | 9/2004 | Levit |
| 2004/0195644 A1* | 10/2004 | Mallikarjunaswamy .......... H01L 27/0738 257/491 |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0047037 A1 | 3/2005 | Litwin et al. |
| 2005/0057866 A1 | 3/2005 | Mergens et al. |
| 2005/0077571 A1 | 4/2005 | Kanda et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0111150 A1 | 5/2005 | Jang et al. |
| 2005/0133869 A1 | 6/2005 | Ker et al. |
| 2005/0151160 A1 | 7/2005 | Salcedo et al. |
| 2005/0195540 A1 | 9/2005 | Streibl et al. |
| 2005/0280091 A1 | 12/2005 | Huang et al. |
| 2006/0033163 A1 | 2/2006 | Chen |
| 2006/0091497 A1 | 5/2006 | Sato |
| 2006/0109595 A1 | 5/2006 | Watanabe et al. |
| 2006/0145260 A1 | 7/2006 | Kim |
| 2006/0186467 A1 | 8/2006 | Pendharkar et al. |
| 2006/0250732 A1 | 11/2006 | Peachey |
| 2007/0007545 A1 | 1/2007 | Salcedo et al. |
| 2007/0058307 A1 | 3/2007 | Mergens et al. |
| 2007/0087500 A1 | 4/2007 | Son et al. |
| 2007/0138558 A1 | 6/2007 | Saitoh |
| 2007/0158748 A1 | 7/2007 | Chu et al. |
| 2008/0044955 A1 | 2/2008 | Salcedo et al. |
| 2008/0067601 A1 | 3/2008 | Chen |
| 2008/0203534 A1 | 8/2008 | Xu et al. |
| 2008/0218920 A1 | 9/2008 | Vanysacker et al. |
| 2008/0237707 A1 | 10/2008 | Suzuki et al. |
| 2009/0032837 A1 | 2/2009 | Tseng et al. |
| 2009/0032838 A1 | 2/2009 | Tseng et al. |
| 2009/0034137 A1 | 2/2009 | Disney et al. |
| 2009/0045457 A1 | 2/2009 | Bodbe |
| 2009/0057715 A1 | 3/2009 | Ryu et al. |
| 2009/0122452 A1 | 5/2009 | Okushima |
| 2009/0206376 A1 | 8/2009 | Mita et al. |
| 2009/0230426 A1 | 9/2009 | Carpenter et al. |
| 2009/0231766 A1 | 9/2009 | Chang et al. |
| 2009/0236631 A1 | 9/2009 | Chen et al. |
| 2009/0309128 A1 | 12/2009 | Salcedo et al. |
| 2010/0027174 A1 | 2/2010 | Galy et al. |
| 2010/0059028 A1 | 3/2010 | Ueno |
| 2010/0109631 A1 | 5/2010 | Vinson |
| 2010/0121404 A1 | 5/2010 | Bjorling et al. |
| 2010/0133583 A1 | 6/2010 | Mawatari et al. |
| 2010/0148265 A1 | 6/2010 | Lin et al. |
| 2010/0155858 A1 | 6/2010 | Chen |
| 2010/0163973 A1 | 7/2010 | Nakamura et al. |
| 2010/0163986 A1 | 7/2010 | Kim |
| 2010/0171149 A1 | 7/2010 | Denison et al. |
| 2010/0232081 A1 | 9/2010 | Disney |
| 2010/0301389 A1 | 12/2010 | Kushner et al. |
| 2010/0321092 A1 | 12/2010 | Momota et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0133246 A1 | 6/2011 | Ueno |
| 2011/0176244 A1 | 7/2011 | Gendron et al. |
| 2011/0207409 A1 | 8/2011 | Ker et al. |
| 2011/0284922 A1 | 11/2011 | Salcedo et al. |
| 2011/0291738 A1 | 12/2011 | Biela et al. |
| 2011/0303947 A1 | 12/2011 | Salcedo et al. |
| 2011/0304944 A1 | 12/2011 | Salcedo et al. |
| 2012/0007138 A1 | 1/2012 | Nguyen |
| 2012/0091503 A1 | 4/2012 | Su |
| 2012/0133025 A1 | 5/2012 | Clarke et al. |
| 2012/0175673 A1 | 7/2012 | Lee |
| 2012/0182659 A1 | 7/2012 | Wang et al. |
| 2012/0194953 A1 | 8/2012 | Mikolajczak |
| 2012/0199874 A1 | 8/2012 | Salcedo et al. |
| 2012/0205714 A1 | 8/2012 | Salcedo et al. |
| 2012/0286325 A1 | 11/2012 | Coyne |
| 2012/0286327 A1 | 11/2012 | Coyne |
| 2012/0286396 A1 | 11/2012 | Coyne |
| 2012/0293904 A1 | 11/2012 | Salcedo et al. |
| 2013/0099280 A1 | 4/2013 | Coyne |
| 2013/0208385 A1 | 8/2013 | Salcedo et al. |
| 2013/0234209 A1 | 9/2013 | Parthasarathy et al. |
| 2013/0242448 A1 | 9/2013 | Salcedo et al. |
| 2013/0270605 A1 | 10/2013 | Salcedo et al. |
| 2013/0330884 A1 | 12/2013 | Salcedo et al. |
| 2014/0138735 A1 | 5/2014 | Clarke et al. |
| 2014/0167104 A1 | 6/2014 | Salcedo |
| 2014/0167105 A1 | 6/2014 | Salcedo et al. |
| 2014/0167106 A1 | 6/2014 | Salcedo |
| 2014/0339601 A1 | 11/2014 | Salcedo et al. |
| 2014/0346563 A1 | 11/2014 | Salcedo et al. |
| 2017/0117266 A1 | 4/2017 | Coyne et al. |

FOREIGN PATENT DOCUMENTS

| | | |
|---|---|---|
| EP | 0508975 A1 | 10/1992 |
| EP | 0 730 293 | 9/1996 |
| EP | 1643549 | 4/2006 |
| EP | 2 246 885 A1 | 11/2010 |
| JP | 2004-533713 | 11/2004 |
| JP | 2007-053314 | 3/2007 |
| JP | 2008-147527 | 6/2008 |
| JP | 11-204737 | 7/2009 |
| KR | 10-2006-0067100 | 2/2006 |
| KR | 10-2009-0123683 | 12/2009 |
| KR | 10-2010-0003569 | 1/2010 |
| TW | 200733305 | 9/2007 |
| WO | WO 90/15442 | 12/1990 |
| WO | WO 9107779 | 5/1991 |
| WO | WO 95/22842 | 8/1995 |
| WO | WO 97/10615 | 3/1997 |
| WO | WO 2008/135812 A1 | 11/2008 |
| WO | WO 2010/011394 A1 | 1/2010 |
| WO | WO 2012/154875 A1 | 11/2012 |

OTHER PUBLICATIONS

De Heyn et al "Design and Analysis of New Protection Structures for Smart Power Technology with Controlled Trigger and Holding Voltage" 2001 IEEE International Reliability Physics Symposium Proceedings $39^{th}$ Annual, Orlando Florida, Apr. 30-May 3, 2001, IEEE International Reliability Physics Symposium, New York, NY, IEEE Apr. 30, 2001, pp. 253-258.

AD524, Analog Devices, "Precision Instrumentation Amplifier," dated Nov. 2007 (28 pgs).

Amerasekara et al., "ESD in Silicon Integrated Circuits" Design and Measurement in Electronic Engineering, Texas Instruments Inc., pp. 44-29, 1995.

Anderson et al., ESD Protection under Wire Bonding Pads, EOS/ESD Symposium 99-88, pp. 2A.4.1-2A.4.7 (1999).

Baliga, "Silicon RF Power Mosfets", World Scientific, 2005, Chapter 4 Lateral-Diffused MOSFETs, 33 pages.

Chang et al., High-k Metal Gate-bounded Silicon Controlled Rectifier for ESD Protection, 34th Electrical Overstress/Electrostatic Discharge Symposium, Sep. 2012, 7 pages.

Gendron et al. "Deep trench NPN Transistor for Low-RON ESD Protection of High-Voltage I/Os in Advanced Smart Power Technology", Bipolar/Bicmos Circuits and Technology Meeting, 2006, IEEE, Piscataway, NJ, USA, Oct. 1, 2006, pp. 1-4.

Luh et al. A Zener-Diode-Activated ESD Protection Circuit for Sub-Micron CMOS Processes, Circuits and Systems, IEEE International Symposium, May 28-31, 2000, Geneva, Switzerland, 4 pages.

Salcedo, J., "Design and Characterization of Novel Devices for New Generation of Electrostatic Discharge (ESD) Protection Structures," Ph.D. Dessertation, Summer Term 2006 (198 pgs).

(56) References Cited

OTHER PUBLICATIONS

Salcedo et al., Bidirectional Devices for Automotive-Grade Electrostatic Discharge Applications, IEEE Electron Device Letters, vol. 33, No. 6, Jun. 2012, 3 pages.

Salcedo et al., Electrostatic Discharge Protection Framework for Mixed-Signal High Voltage CMOS Applications, IEEE Xplore, downloaded Feb. 23, 2010 at 12:53 EST, 4 pages.

Salcedo et al., On-Chip Protection for Automotive Integrated Circuits Robustness, 2012 8th International Caribbean Conference on Devices, Circuits and Systems (ICCDCS), 5 pages, Mar. 2012.

Urresti J et al: "Lateral punch-through TVS devices for on-chip protection in low-voltage applications", Microelectronics and Reliability, Elsevier Science Ltd, GB, vol. 45, No. 7-8, Jul. 1, 2005, pp. 1181-1186, XP027853635.

Walker A J et al: "Novel Robust High Voltage ESD Clamps for LDMOS Protection ", Physics Symposium, 2007, Proceedings, 45$^{th}$ Annual, IEEE International, IEEE, PI, Apr. 1, 2007, pp. 596-597.

\* cited by examiner

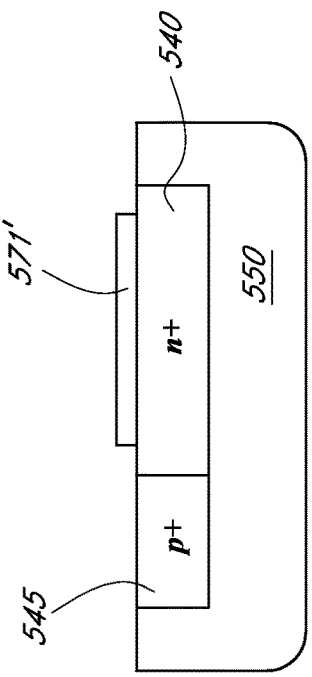
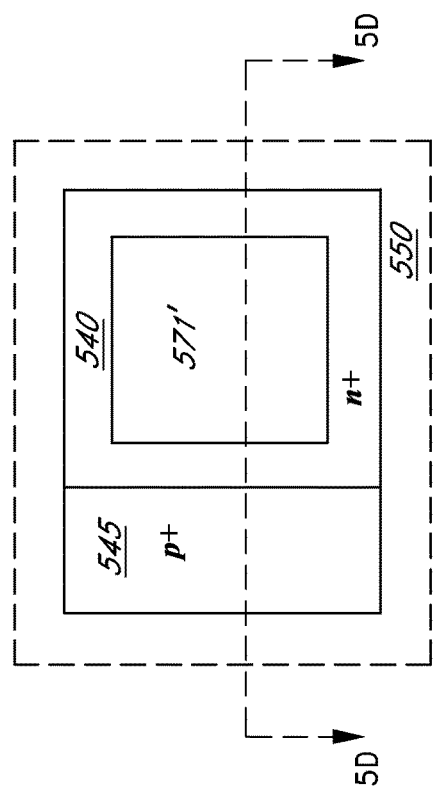
FIG.5D
FIG.5C

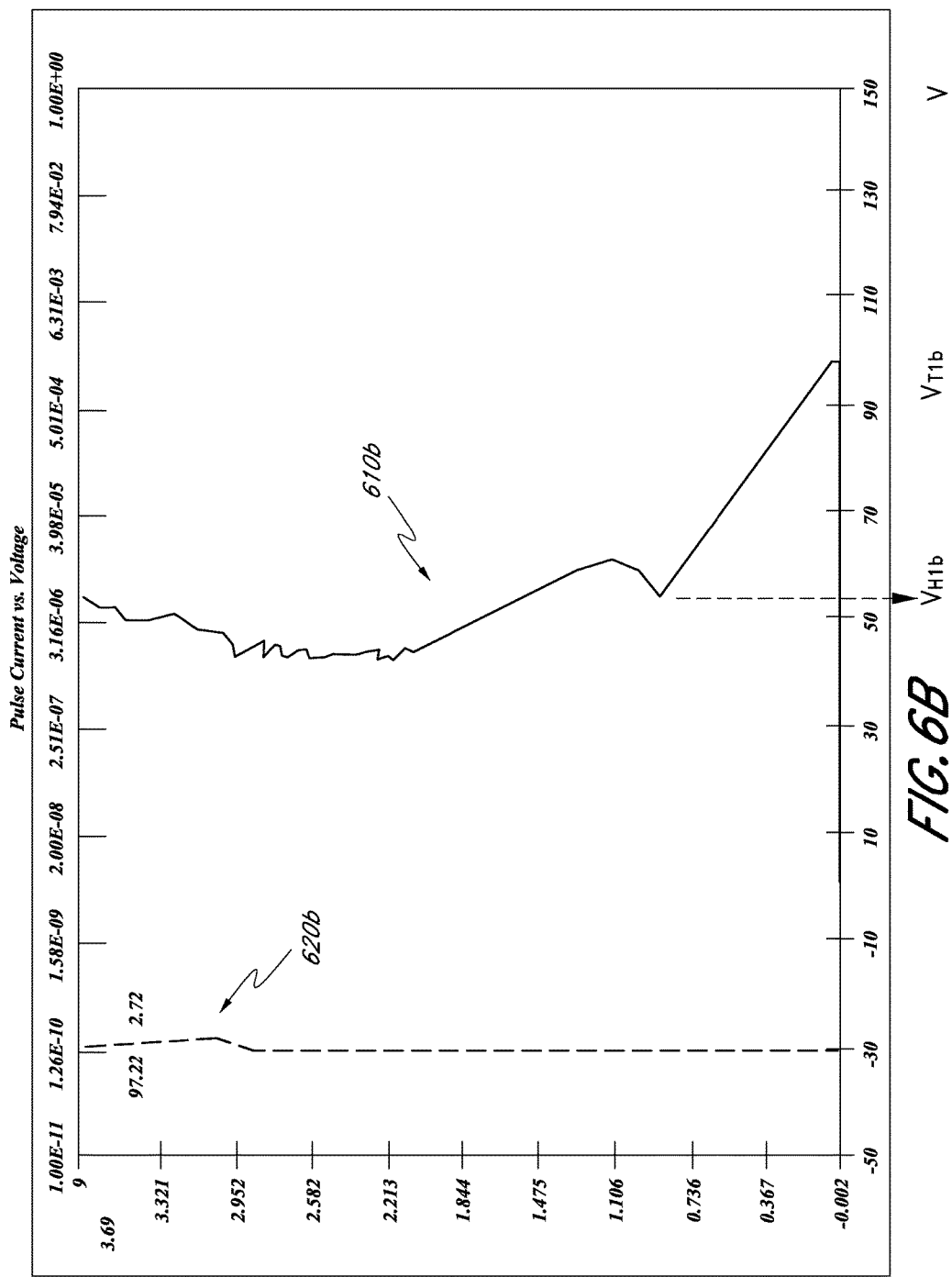

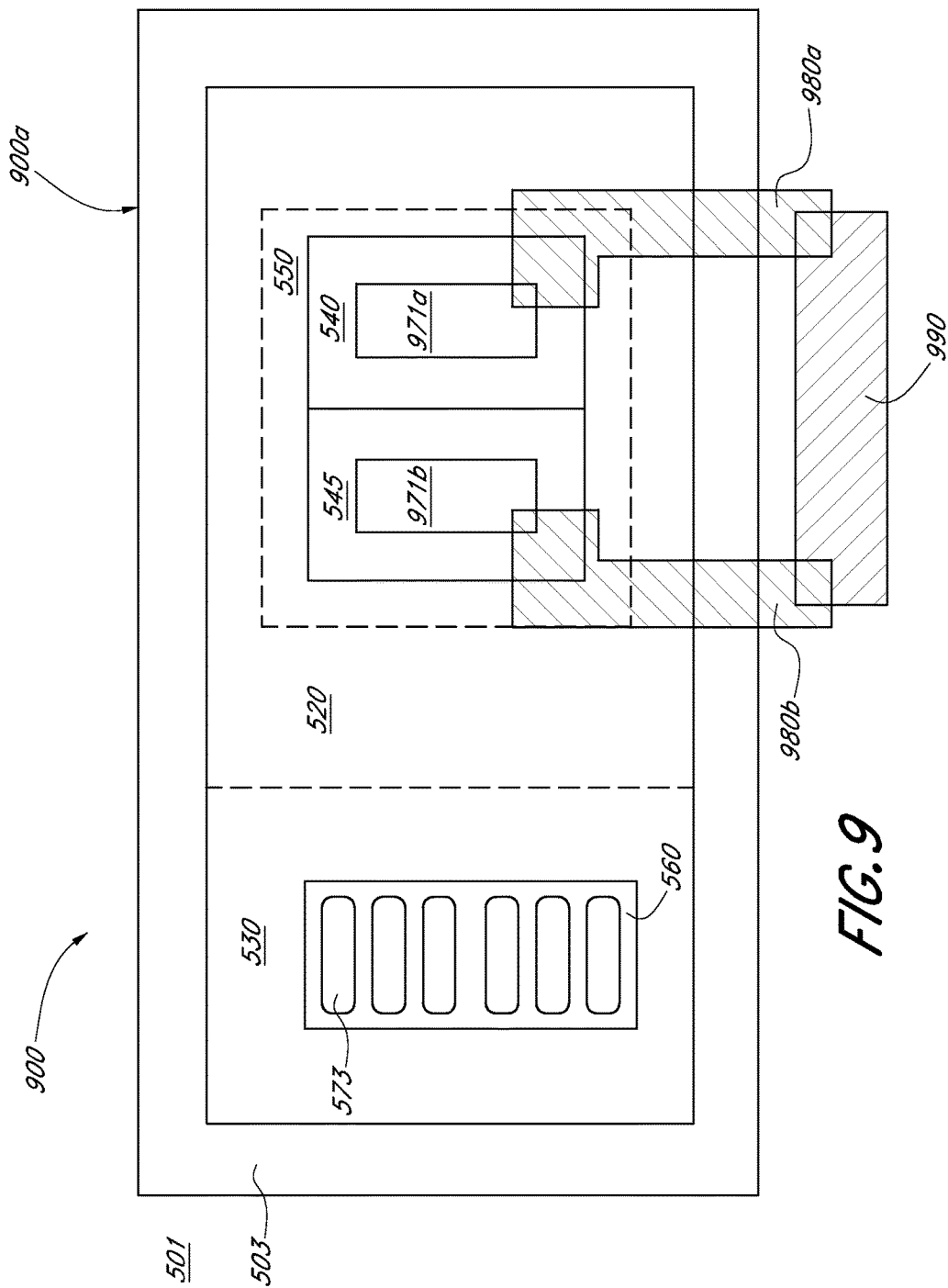

APPARATUS FOR ELECTROSTATIC DISCHARGE PROTECTION

BACKGROUND

Field

Embodiments of the invention relate to electronic devices, and more particularly, in one or more embodiments, to electrostatic discharge protection.

Description of the Related Technology

Certain electronic circuits can be exposed to overvoltage or undervoltage conditions. The overvoltage or undervoltage conditions can include, for example, electro static discharge (ESD) events arising from the abrupt release of charge from an object or person to an electronic system.

Such overvoltage or undervoltage conditions can damage electronic circuits or adversely affect the operations of the circuits. Various protection circuits have been developed to provide protection over electronic circuits from overvoltage or undervoltage conditions.

SUMMARY

In one embodiment, an apparatus includes an electrostatic discharge (ESD) protection device configured to protect a circuit from overvoltage and/or undervoltage conditions. The protection device comprises: an emitter region having a first diffusion polarity; and a collector region laterally spaced apart from the emitter region. The collector region has the first diffusion polarity. The protection device further includes a barrier region interposed laterally between the emitter region and the collector region. The barrier region laterally contacts at least a portion of the emitter region, and has a second diffusion polarity opposite from the first diffusion polarity. The protection device also includes a base region having the second diffusion polarity. The base region laterally surrounds and underlies the emitter region and the barrier region, wherein the barrier region has a higher dopant concentration than the base region.

In another embodiment, an electronic device comprises an internal circuit electrically coupled to a first power supply rail, a second power supply rail, an input node, and an output node; and a bipolar device electrically coupled to one or more of the first power supply rail, the second power supply rail, the input node, or the output node. The bipolar device comprises: an emitter region having a first diffusion polarity; a collector region laterally spaced apart from the emitter region, the collector region having the first diffusion polarity; and a barrier region interposed laterally between the emitter region and the collector region such that the barrier region blocks a lateral current flow from the collector region to the emitter region during an electrostatic discharge (ESD) event, the barrier region having a second diffusion polarity opposite from the first diffusion polarity.

In yet another embodiment, a method comprises forming a bipolar protection device comprising: an emitter region having a first diffusion polarity; a collector region laterally spaced apart from the emitter region, the collector region having the first diffusion polarity; a barrier region interposed laterally between the emitter region and the collector region, the barrier region laterally contacting at least a portion of the emitter region, the barrier region having a second diffusion polarity opposite from the first diffusion polarity; and a base region having the second diffusion polarity, the base region laterally surrounding and underlying the emitter region and the barrier region, wherein the barrier region has a higher dopant concentration than the base region. The method also includes forming an internal circuit electrically coupled to the protection device.

BRIEF DESCRIPTION OF THE DRAWINGS

FIG. 5C is a schematic partial top plan view of a bipolar ESD protection device according to another embodiment.

FIG. 5D is a partial cross-section of the device of FIG. 5C, taken along the line 5D-5D.

FIG. 6B is a graph illustrating a leakage current and a relationship between output current and input voltage of the device of FIG. 5A.

FIG. 9 is a schematic top plan view of a bipolar ESD protection device according to yet another embodiment.

DETAILED DESCRIPTION OF EMBODIMENTS

Figure 1A:
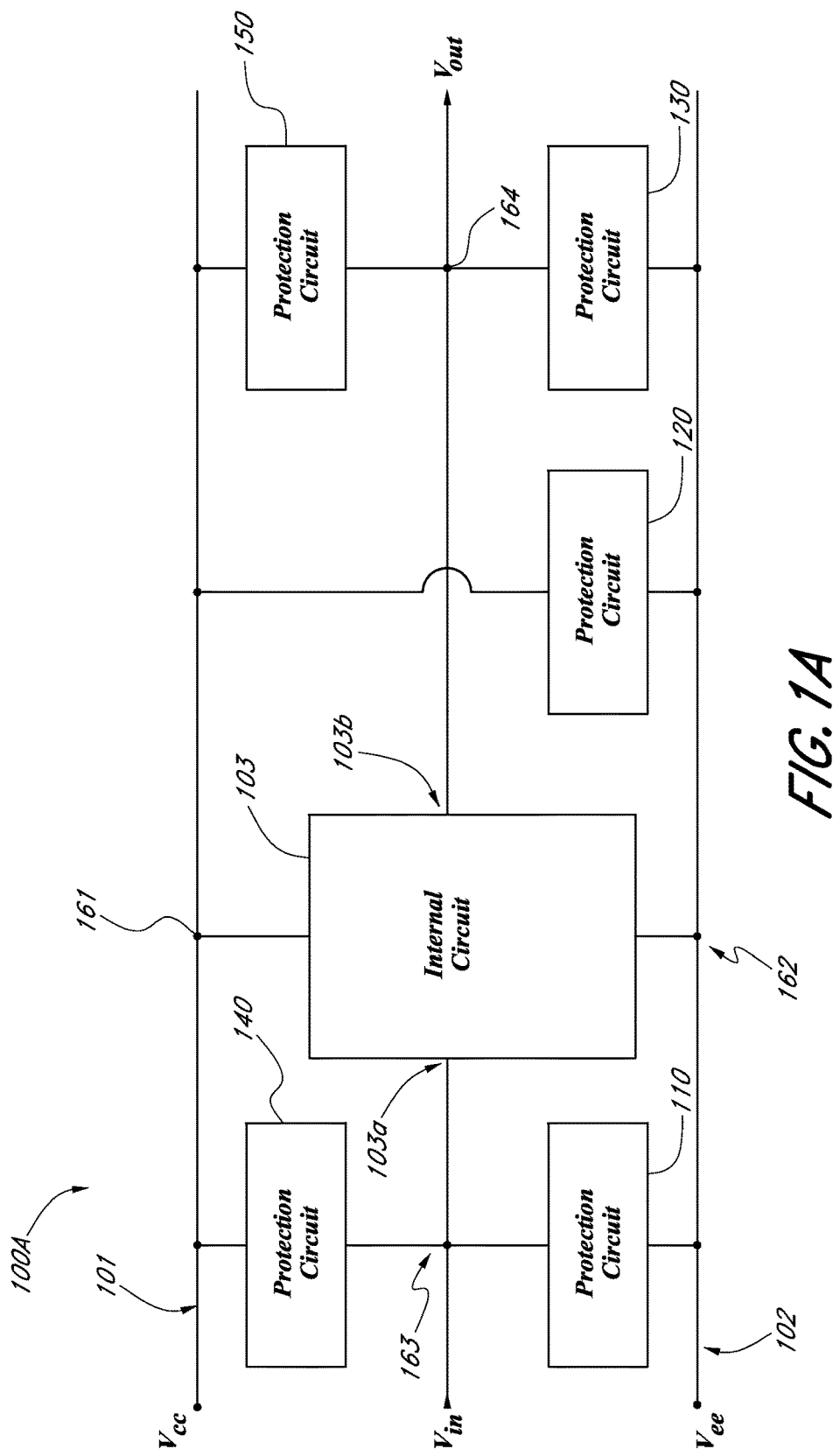
FIG. 1A is a schematic block diagram of an electronic system including an internal circuit and ESD protection circuits according to one embodiment.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described below, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described below.

Electronic Devices with Electrostatic Discharge Protection

Referring to FIG. 1A, an electronic device including an internal circuit and protection circuits according to one embodiment will be described below. The illustrated electronic device 100A includes a first power supply rail 101, a second power supply rail 102, an internal circuit 103, first to fifth protection circuits 110-150, and first to fourth nodes 161-164. The third node 163 can also be referred to as an "input node." The fourth node 164 can also be referred to as an "output node."

In one embodiment, the protections circuits 110-150 are integrated with the internal circuit 103 in a common semiconductor substrate for system-on-a-chip applications. In other embodiments, one or more of the protections circuits 110-150 can be placed in a stand-alone IC, in a common package for system-on-a-package applications, and electrically coupled to the internal circuit 103.

The first power supply rail 101 is electrically coupled to a first voltage source Vcc, and the second power supply rail 102 is electrically coupled to a second voltage source Vee. In one embodiment, the first voltage source Vcc can provide a voltage between about 2.7 V and about 36 V, for example, about 36 V. The second voltage source Vee provides a voltage between about −18 V and about 0 V, for example, about −18 V or about 0 V. In some embodiments, the first voltage source Vcc and the second voltage source Vee can provide voltages of about 33 V (±10%) and about 0 V (±10%), respectively, for unipolar operation. In other embodiments, the first voltage source Vcc and the second voltage source Vee can provide voltages of about +16.5 V (±10%) and −16.5 V (±10%), respectively, for bipolar operation.

The internal circuit 103 is electrically coupled to the first and second power supply rails 101, 102 at the first and second nodes 161, 162, respectively, to receive power. The internal circuit 103 can include one or more integrated circuits (ICs) having any configurations and functions, which need electrostatic discharge protection. The internal circuit 103 can include an input 103a electrically coupled to the third node 163, and an output 103b electrically coupled to the fourth node 164. In some embodiments, the electronic device can also include a resistor between the third node 163 and the input 103a, and/or between the fourth node 164 and the output 103b to reduce a current flow to the internal circuit 103 during an ESD event. The internal circuit 103 can receive an input voltage signal $V_{IN}$ at the input 103a, and output an output voltage signal $V_{OUT}$ at the output 103b.

In the illustrated embodiment, the first protection circuit 110 has a first terminal electrically coupled to the third node 163, and a second terminal electrically coupled to the second node 162. The first protection circuit 110 can serve to protect the third node 163 coupled to the input 103a of the internal circuit 103 from an ESD event occurring between the first node 163 and the second power supply rail 102 (or some other node or pad coupled to the internal circuit 103), which has a voltage exceeding that of the first power supply rail 101 and/or an ESD event having a voltage much below the second power supply rail 102.

The second protection circuit 120 has a first terminal electrically coupled to the first node 161, and a second terminal electrically coupled to the second node 162. The second protection circuit 120 can serve to protect the internal circuit 103 from an ESD event occurring between the first and second power supply rail 101, 102.

The third protection circuit 130 has a first terminal electrically coupled to the fourth node 164, and a second terminal electrically coupled to the second node 162. The third protection circuit 130 can serve to protect the fourth node 164 coupled to the output 103b of the internal circuit 103 from an ESD event occurring between the fourth node 164 and the second power supply rail 102 (or some other node or pad coupled to the internal circuit 103), which has a voltage exceeding that of the first power supply rail 101 and/or an ESD event having a voltage much below the second power supply rail 102.

The fourth protection circuit 140 has a first terminal electrically coupled to the first node 161, and a second terminal electrically coupled to the third node 163. The fourth protection circuit 140 can serve to protect the third node 163 from an ESD event occurring between the first node 163 and the first power supply rail 101 (or some other node or pad coupled to the internal circuit 103), which has a voltage exceeding that of the first power supply rail 101 and/or an ESD event having a voltage much below the second power supply rail 102.

The fifth protection circuit 150 has a first terminal electrically coupled to the first node 161, and a second terminal electrically coupled to the fourth node 164. The fifth protection circuit 150 can serve to protect the fourth node 164 from an ESD event occurring between the fourth node 164 and the first power supply rail 101 (or some other node or pad coupled to the internal circuit 103), which has a voltage exceeding that of the first power supply rail 101 and/or an ESD event having a voltage much below the second power supply rail 102.

Figure 1B:
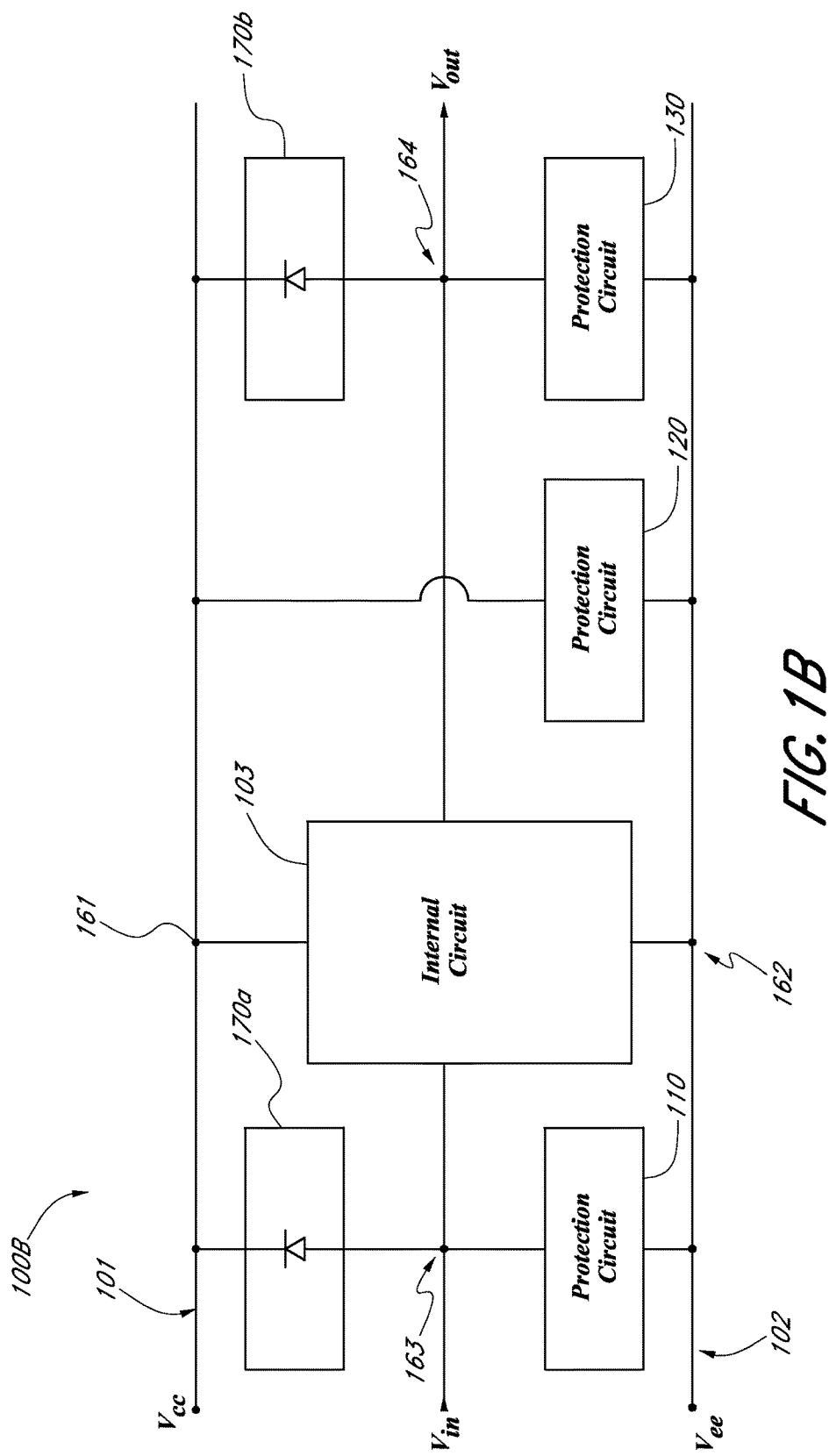
FIG. 1B is a schematic block diagram of an electronic system including an internal circuit, ESD protection circuits, and ESD diodes according to another embodiment.

Referring to FIG. 1B, an electronic device including an internal circuit and protection circuits according to another embodiment will be described below. The illustrated electronic device 100B includes a first power supply rail 101, a second power supply rail 102, an internal circuit 103, first to third protection circuits 110-130, first and second voltage clamp diodes 170a, 170b, and first to fourth nodes 161-164. The details of the components of the electronic device 100B can be as described above in connection with those of the device 100A of FIG. 1A except that the device 100B includes the first and second voltage clamp diodes 170a, 170b for the fourth and fifth protection circuits 140, 150, respectively, of the device 100A of FIG. 1A. In the context of this document, the term "voltage clamp diode" may also be referred to as an "ESD diode."

The first voltage clamp diode 170a can have a cathode electrically coupled to the first node 161, and an anode electrically coupled to the third node 163. The second voltage clamp diode 170b can have a cathode electrically coupled to the first node 161, and an anode electrically coupled to the fourth node 164. The voltage clamp diodes 170a, 170b can serve to protect the third node 163 and the fourth node 164 of the internal circuit 103 from an ESD event having a voltage exceeding that of the first power supply rail 101 and/or an ESD event having a voltage much below the second power supply rail 101, but with a weaker ESD protection than the protection circuits 140 and 150 of FIG. 1, which will be described later in connection with FIG.

2. In other embodiments, the first voltage clamp diode 170a can be coupled in series with one or more additional voltage clamp diodes between the first and third nodes 161, 163. Similarly, the second voltage clamp diode 170b can be coupled in series with one or more additional voltage clamp diodes between the first and fourth nodes 161, 164.

Figure 1C:
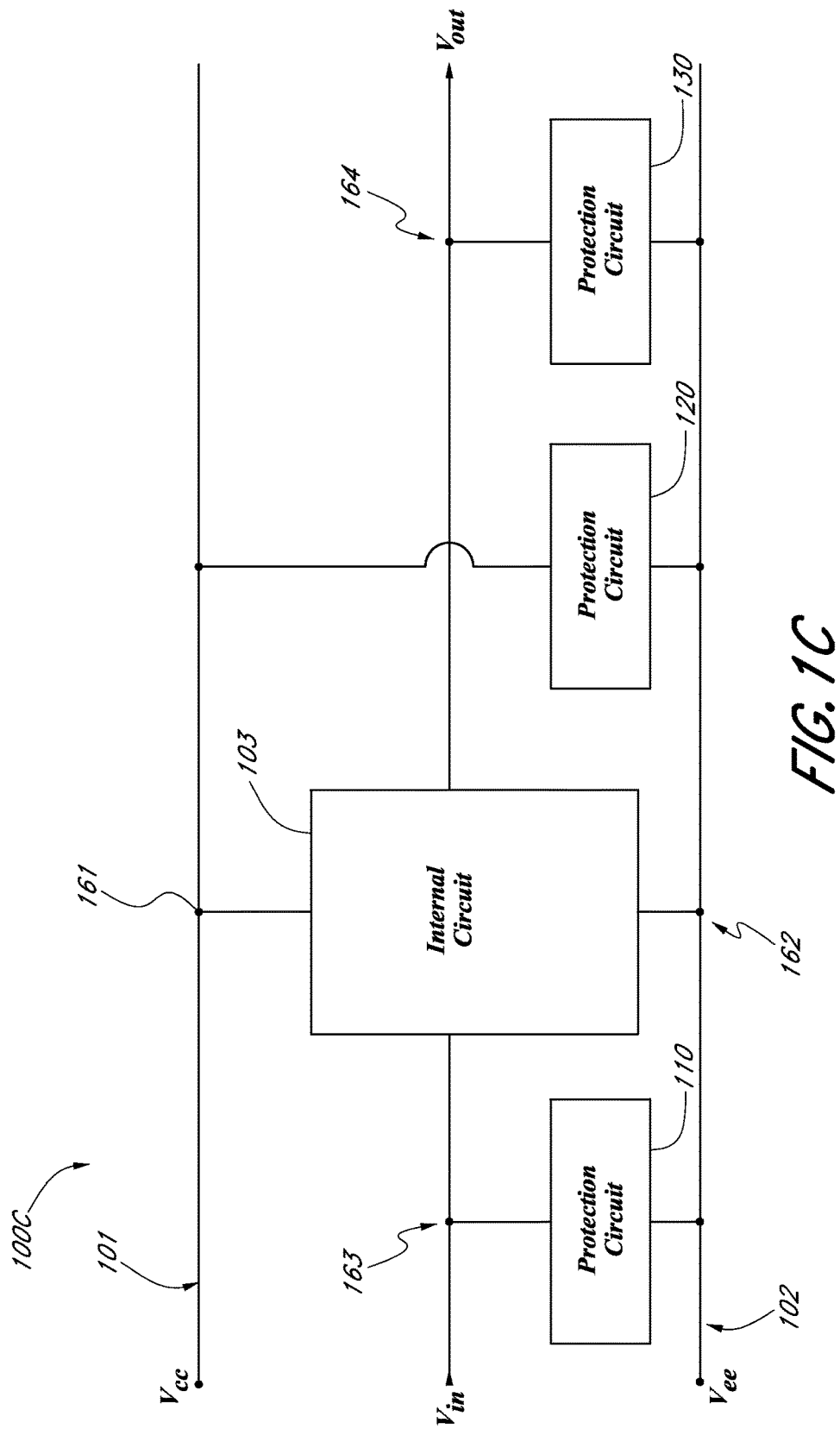
FIG. 1C is a schematic block diagram of an electronic system including an internal circuit and ESD protection circuits according to yet another embodiment.

Referring to FIG. 1C, an electronic device including an internal circuit and protection circuits according to another embodiment will be described below. The illustrated electronic device 100C includes a first power supply rail 101, a second power supply rail 102, an internal circuit 103, first to third protection circuits 110-130, and first to fourth nodes 161-164. The details of the components of the electronic device 100B can be as described above in connection with those of the device 100A of FIG. 1A except that the device 100C does not include the fourth and fifth protection circuits 140, 150 of the device 100A of FIG. 1A. By having no protection circuit between the first power supply rail 101 and the third node 163 or between the first power supply rail 101 and the fourth node 164, the input voltage $V_{IN}$ or output voltage $V_{OUT}$ can exceed the voltage of the first power supply rail 101, which can be required in some applications. In an ESD event between the third node 163 and the second power supply rail 102, a current can flow through the first protection circuit 110 to the second power supply rail 102, and then through the second protection circuit 120 to the first power supply rail 101. In yet another embodiment, the electronic device 100C of FIG. 1C can include a protection circuit either between the first power supply rail 101 and the third node 163 or between the first power supply rail 101 and the fourth node 164.

ESD Protection Circuits

Figure 2:
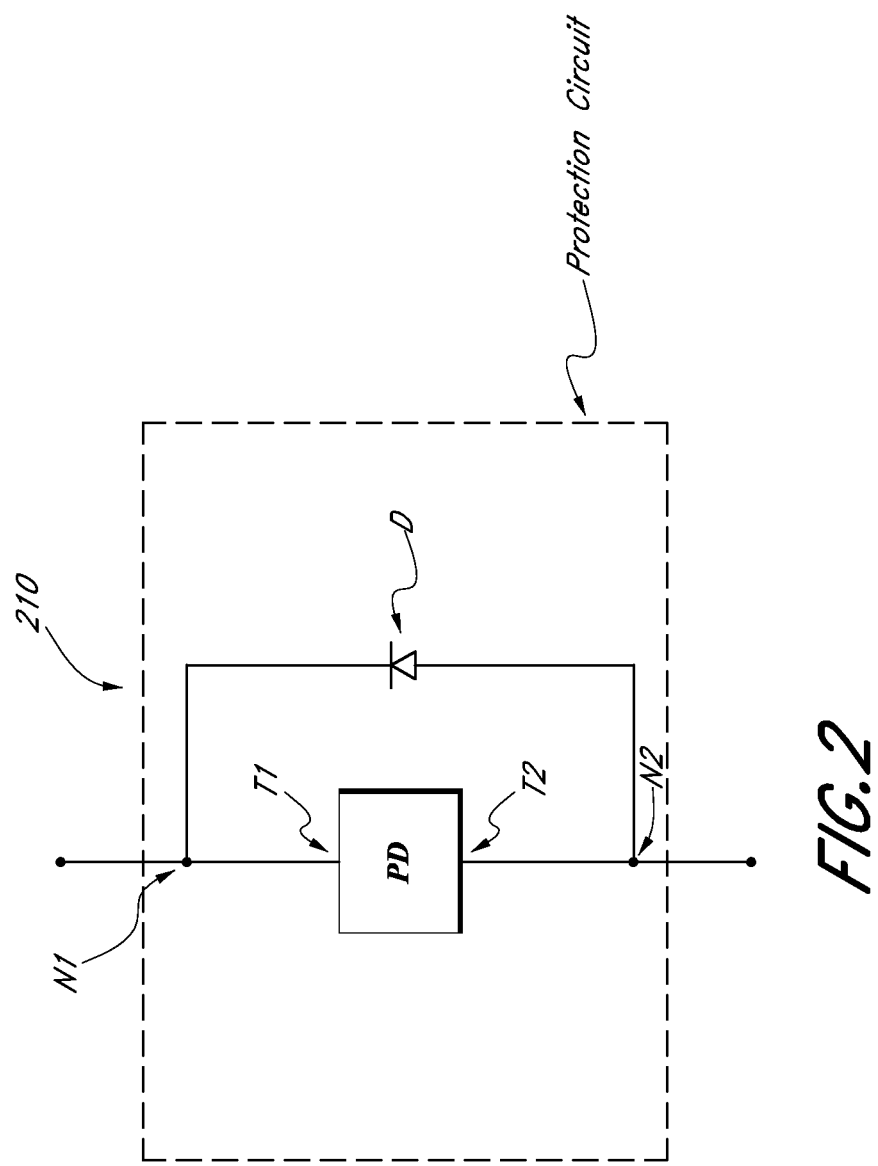
FIG. 2 is a circuit diagram of an ESD protection circuit according to one embodiment.

Referring to FIG. 2, an ESD protection circuit according to one embodiment will be described below. The illustrated protection circuit 210 includes a bipolar protection device PD and a diode D coupled in parallel between a first node N1 and a second node N2. The protection circuit 210 can form a part or the whole of any of the protection circuits 110-150 of the electronic devices 100A-100C of FIGS. 1A-1C.

The bipolar protection device PD can have a first terminal T1 electrically coupled to the first node N1, and a second terminal T2 electrically coupled to the second node N2. The diode D can have an anode electrically coupled to the second node N2, and a cathode electrically coupled to the first node N1.

The protection device PD can serve to provide protection over an internal circuit when an overvoltage event occurs. In the context of this document, the protection device PD can also be referred to as a "snapback device." The diode D can serve to provide protection over the internal circuit when an undervoltage event occurs.

Figure 3:
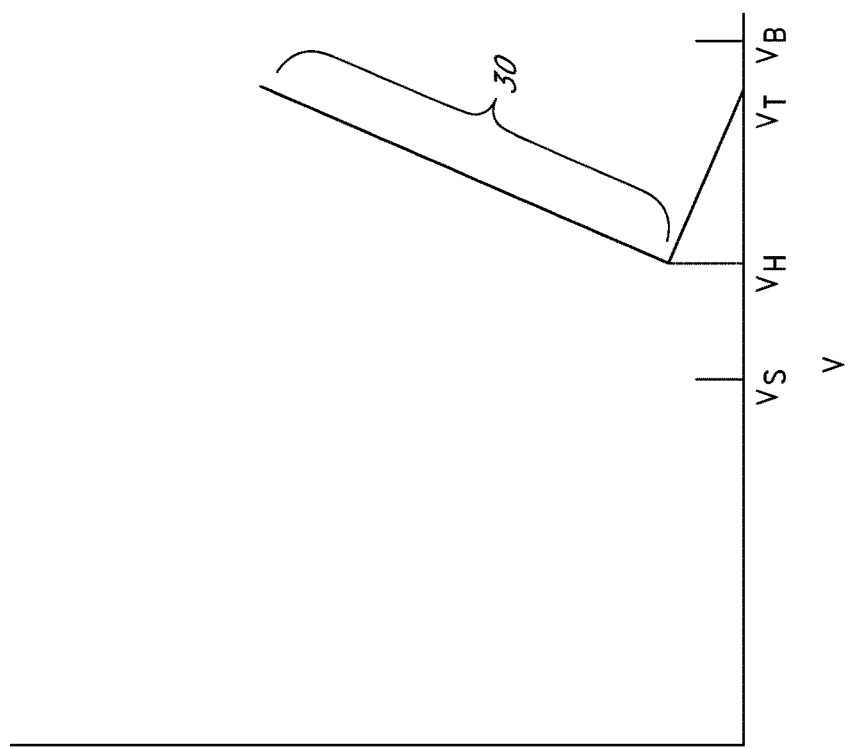
FIG. 3 is a graph illustrating a relationship between output current and input voltage of an example ESD protection device.

The protection device PD can have operating characteristics, for example, as shown in FIG. 3. Ideally, the protection device PD does not pass any current until a trigger voltage $V_T$ is reached. The trigger voltage $V_T$ should be less than a breakdown voltage $V_B$ for an internal circuit being protected. Once the trigger voltage $V_T$ is reached, the protection device PD starts conducting a current, and the voltage across the protection device PD falls back to a holding voltage $V_H$ which is lower than the trigger voltage $V_T$. From the holding voltage $V_H$, ideally a current flow would increase without an increase in the voltage across the protection device PD. Practically, however, due to resistance within the protection device PD, the voltage can increase slightly as the current flow increases in the region 30.

The holding voltage $V_H$ should be above the power supply rail voltage (for example, Vcc in FIGS. 1A-1C) by, for example, at least about 4 or 5 V, (alternatively, about 10% higher than the power supply rail voltage) in order to accommodate temperature and process variations. Otherwise, once the protection device PD is switched on, it would not switch off. Once the voltage across the protection device PD decreases below the holding voltage $V_H$, the protection device PD can turn off by itself, thereby returning to a high impedance state.

In one embodiment (for example, in the device of FIG. 1A), the first supply voltage can be about 36 V, and the holding voltage $V_H$ of one or more of the protection circuits 110-150 can be, for example, about 40V. The breakdown voltage $V_B$ can be, for example, about 69 V. A skilled artisan will appreciate that the characteristic of the protection device PD can vary widely, depending on the configuration and need of the internal circuit 103.

ESD Protection Device with Improved ESD Rating

In one embodiment, an ESD protection device can include a structure similar to a bipolar device, such as a bipolar transistor. Such an ESD protection device can include an emitter region, a base region, a collector region, and a barrier region interposed laterally between the emitter region and the collector region. The barrier region can be doped with the same type of dopant as the base region while having a higher concentration than the base region. The barrier region blocks a current from flowing laterally from the collector region to the emitter region during an ESD event.

In the ESD protection device, a base-collector breakdown occurrence during an ESD event results in a vertical current flow through the device. In such an instance, a snapback mechanism can be triggered so as to limit the voltage developed in the protection device. A current resulting from the snapback mechanism can be spread over a large junction area between the emitter region and the base region, thereby increasing the ESD rating of the device. Further, the trigger voltage of the device is tunable by simple spacing variations.

In another embodiment, a collector ring diffusion can be added without affecting the trigger mechanism or the high current carrying capability of the device in snapback. Such a collector ring permits a lower breakdown voltage, a lower trigger voltage, and a less leakage current than without it.

Generally, the ESD rating of a protection device is inversely proportional to the holding voltage of the protection device. Thus, if the holding voltage is too high, the ESD rating of the device can be too low. However, it is desirable to provide a protection device having a holding voltage higher than the maximum operating voltage of a power supply so that the protection device can turn off at a voltage below the power supply voltage. Further, it is desirable to provide a protection device, of which the trigger voltage can be easily adjusted during fabrication.

Figure 4A:
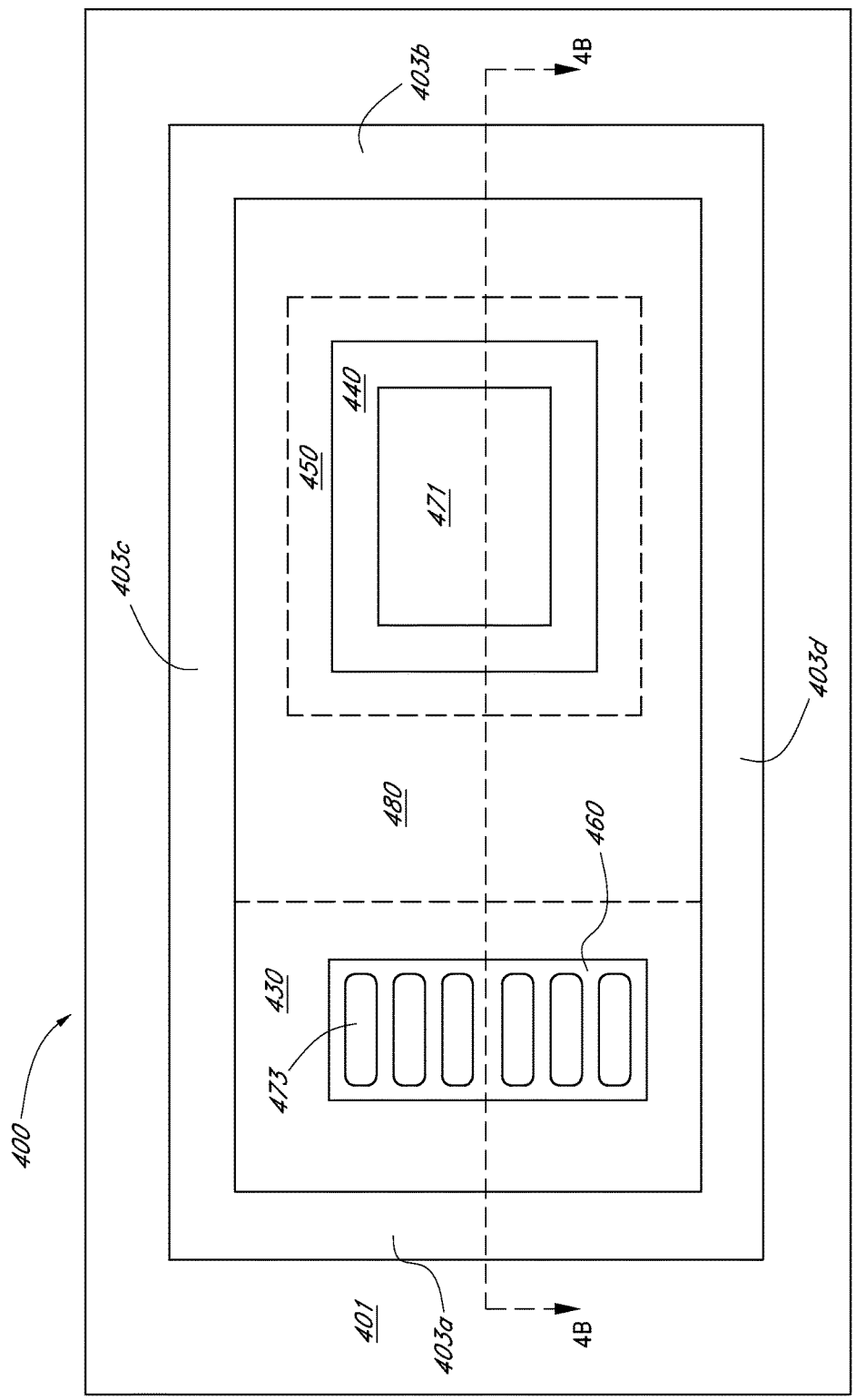
FIG. 4A is a schematic top plan view of a bipolar ESD protection device according to one embodiment.
Figure 4B:
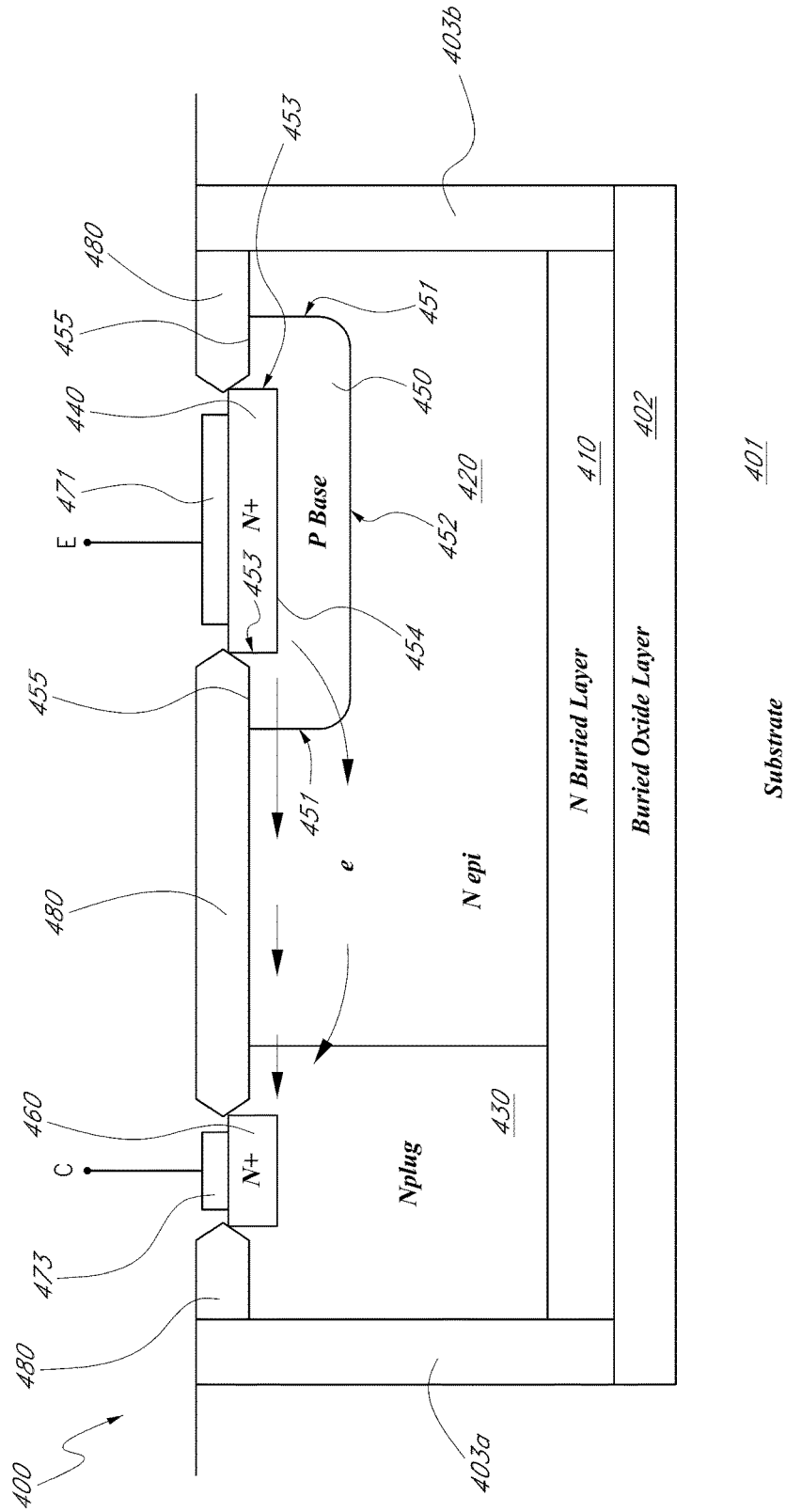
FIG. 4B is a cross-section of the device of FIG. 4A, taken along the line 4B-4B.

Referring to FIGS. 4A and 4B, one embodiment of a bipolar protection device will be described below. FIG. 4A is a schematic top plan view of the protection device, and FIG. 4B is a cross-section of the protection device, taken along the line 4B-4B. The illustrated protection device 400 can form, for example, the protection device PD of FIG. 2.

The protection device 400 shown in FIGS. 4A and 4B can be a silicon-on-insulator (SOI) isolated well device. As such, the protection device 400 sits in its own "island" of semiconductor material, which is formed in a well of insulation and is insulated from the devices outside the well on the same monolithic integrated circuit. In this embodiment, a handle wafer 401 acts as a carrier substrate and has a buried oxide layer 402 formed of silicon dioxide on the wafer 401.

Trench side walls 403a-403d are also formed (typically of silicon dioxide) so as to isolate the island of silicon forming the protection device 400 in a well formed by the layer 402 and the side walls 403a-403d. The process for forming the layer 402 and the side walls 403a-403d can be a conventional fabrication process. In other arrangements, the well of semiconductor material can be junction isolated. Such a well can be referred to as a well of isolation or insulation. The protection device 400 can include an N buried layer 410, an N epitaxial layer 420, an N plug 430, an N+ emitter region 440, a P base region 450, an N+ collector region 460, an emitter contact 471, a collector contact 473, and an insulating layer 480. In one embodiment, the components of the protection device 400 can be formed by a bipolar process or a BiCMOS process. While illustrated in the context of n-type dopants, the principles and advantages described are applicable to p-type dopants in all the embodiments described in connection with FIGS. 4A, 4B, 5A-5D, 7A, 7B, 8A, 8B, and 9.

The N buried layer 410 is formed on the buried oxide layer 402, and includes n-type dopants. The N epitaxial layer 420 is a layer epitaxially grown on the N buried layer 410. The N plug 430 is formed on the N buried layer 410 and is adjacent to the N epitaxial layer 420 such that the N plug 430 is surrounded and contacted by the side walls 403a, 403c, 403d and the N epitaxial layer 420.

The emitter region 440 contains an n-type dopant, forming an n+ region, and is formed in a shallow trench shape. The emitter region 440 can also be referred to as a "first n-region" in the illustrated embodiment. The emitter region 440 has side surfaces and a bottom surface contacting the base region 450 while having a top surface exposed above through an opening in the insulating layer 480. The emitter contact 471 is formed on at least a portion of the top surface of the emitter region 440. The emitter contact 471 can serve as the second terminal T2 of the protection device PD of FIG. 2.

The base region 450 contains a p-type dopant, and is formed in a trench shape. The base region 450 can also be referred to as a "first p-region" in the illustrated embodiment. The base region 450 has outer side surfaces 451 and a bottom surface 452 that contact the N epitaxial layer 420. The base region 450 also has inner side surfaces 453 and a first top surface 454 that contact the emitter region 440. The base region 450 further includes a second top surface 455 on which the insulating layer 480 is formed. The base region 450 is floating with no electrical or conductive contact coupled thereto.

The collector region 460 contains an n-type dopant, and is formed in a trench shape in a top portion of the N plug 430. The collector region 460 can also be referred to as a "second n-region" in the illustrated embodiment. The collector region 460 has side surfaces and a bottom surface contacting the N plug 430 while having a top surface exposed above through an opening in the insulating layer 480. The collector contact 473 is formed on at least a portion of the top surface of the collector region 460. The collector contact 473 can serve as the first terminal T1 of the protection device PD of FIG. 2.

During operation, when a voltage difference between the emitter contact 471 and the collector contact 473 (the voltage at the emitter contact 471 is lower than the voltage at the collector contact 473) reaches a trigger voltage $V_{T1}$, a current flows from the collector region 460 to the emitter region 440 through the N plug 430, the N epitaxial layer 420, and the P base region 450 in sequence. The current flows through side surfaces of the emitter region 440 and the P base region 450, which have a smaller area than the bottom surfaces of the regions 440, 450. Thus, the protection device 400 has a relatively small current carrying capability. The arrows shown in FIG. 4B represent an electron flow when the current flows.

Figure 6A:
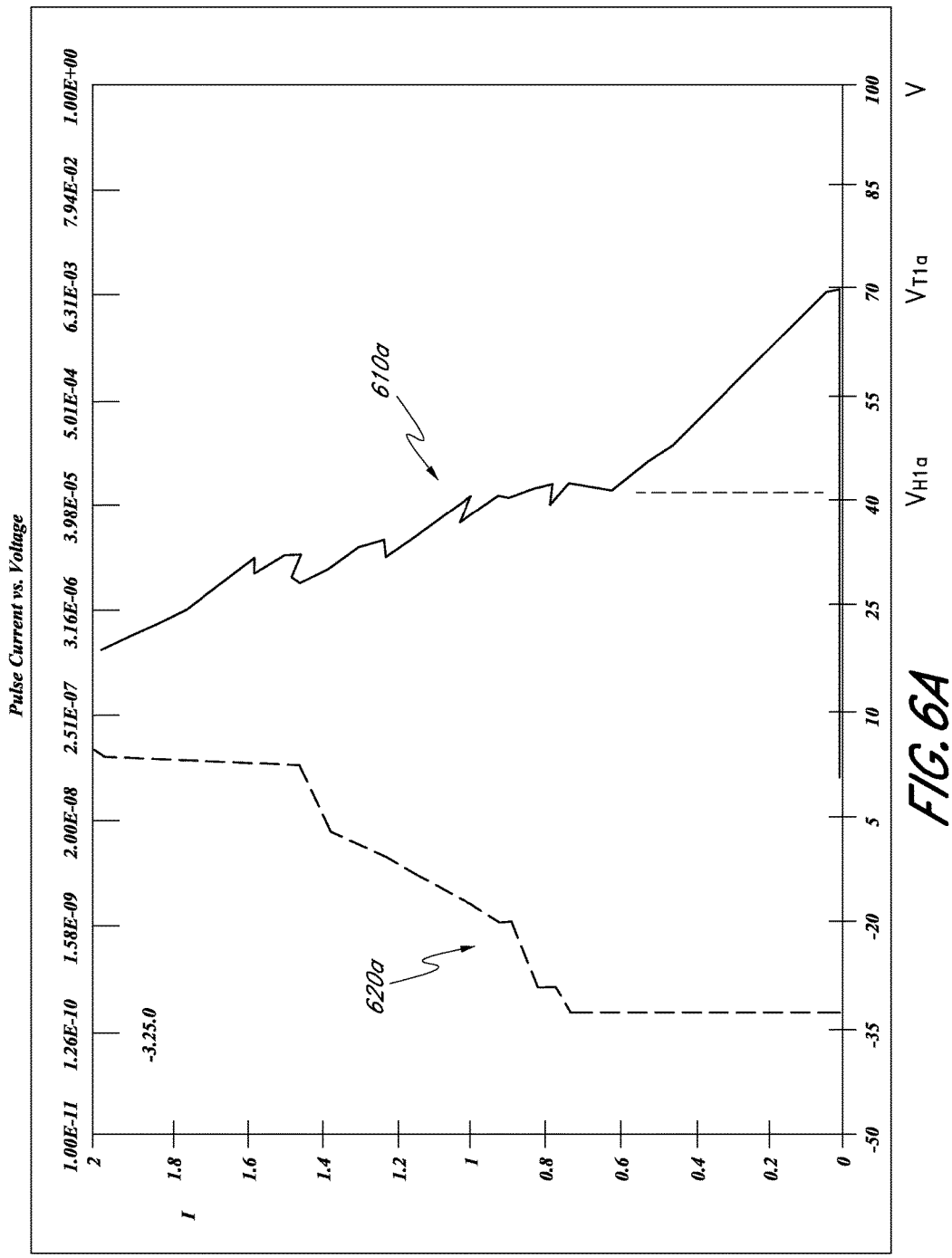
FIG. 6A is a graph illustrating a leakage current and a relationship between output current and input voltage of the device of FIG. 4A.

The protection device 400 can have operating characteristics as shown in FIG. 6A. In the illustrated comparative example, the trigger voltage $V_{T1a}$ of the protection device 400 is about 70 V while the holding voltage $V_{H1a}$ of the protection device is about 40 V. When the voltage across the protection device 400 reaches the holding voltage $V_{H1a}$, a current flow can increase while the voltage across the protection device 400 decreases in a region 610a. FIG. 6A also shows that there is a high leakage current in a region 620a above about 0.7 A when a pulsed voltage signal is applied to the protection device 400. This shows that the protection device 400 is subjected to a leakage damage mechanism at or above 0.7 A, and has a relatively small ESD capability. Typically, it is desirable that an ESD device has substantially no leakage current at or below about 1.3 A.

Figure 5A:
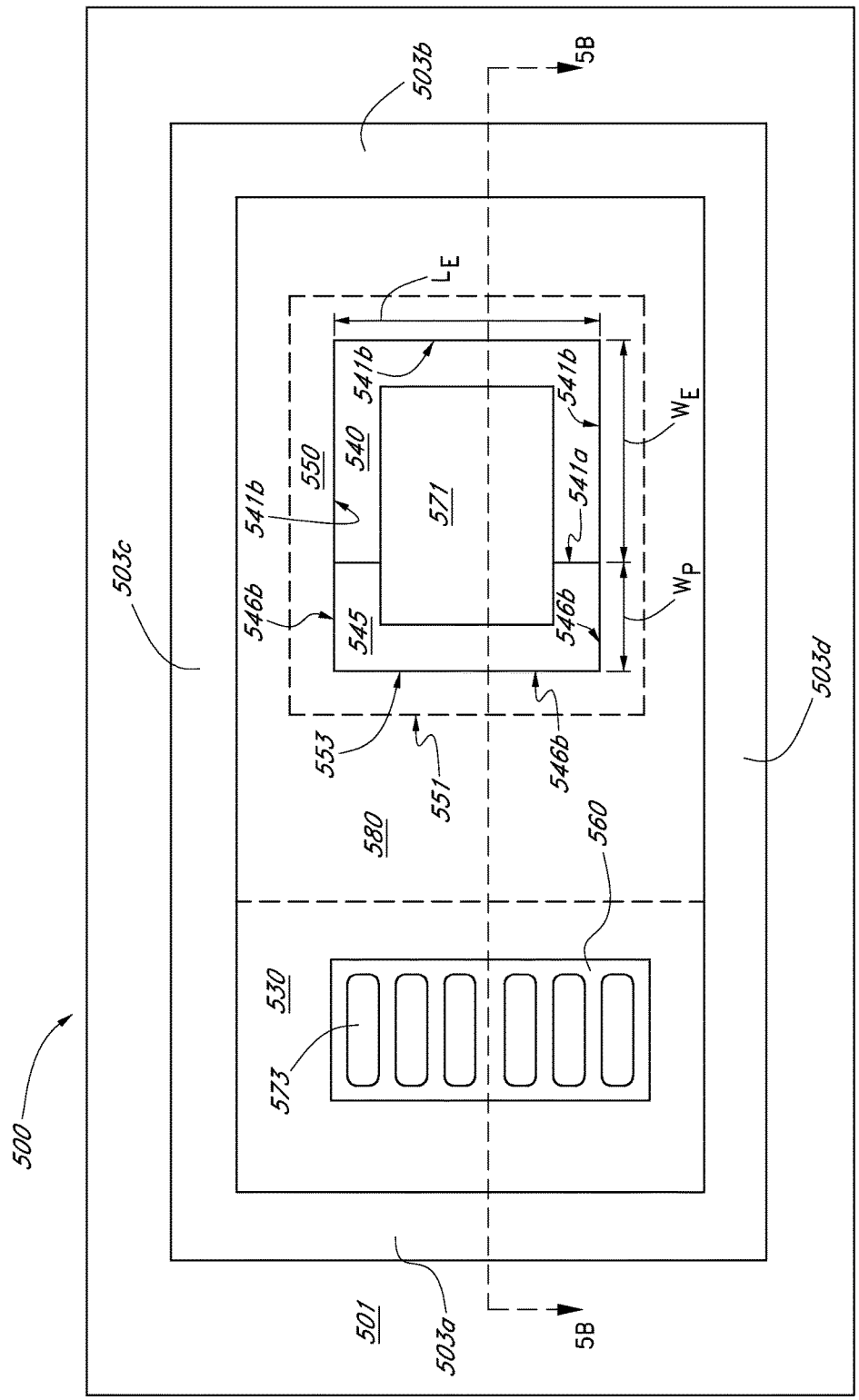
FIG. 5A is a schematic top plan view of a bipolar ESD protection device according to another embodiment.
Figure 5B:
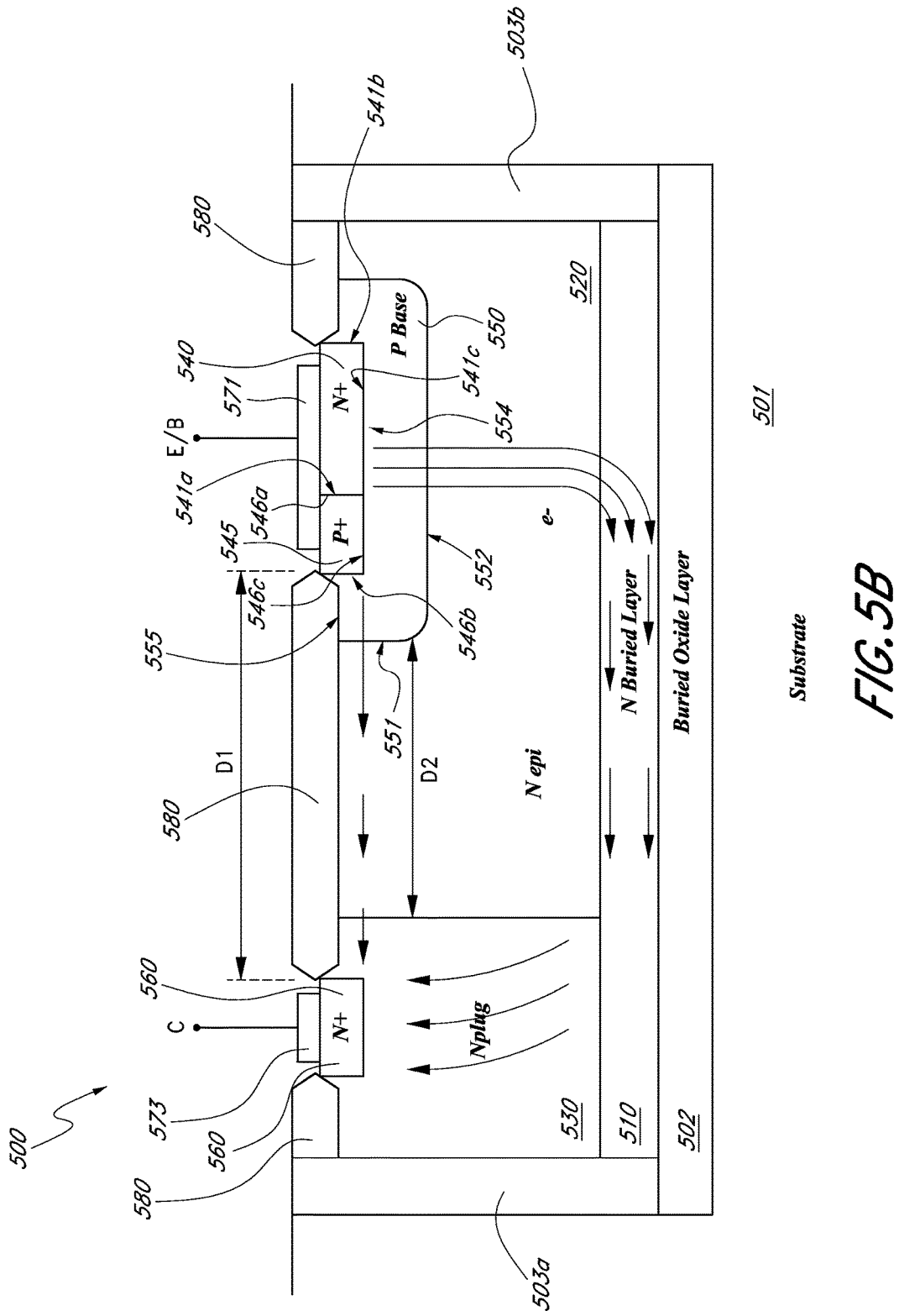
FIG. 5B is a cross-section of the device of FIG. 5A, taken along the line 5B-5B.

Referring to FIGS. 5A and 5B, a bipolar protection device according to another embodiment will be described below. FIG. 5A is a schematic top plan view of the protection device, and FIG. 5B is a cross-section of the protection device, taken along the line 5B-5B. The illustrated protection device 500 can form, for example, the protection device PD of FIG. 2.

The protection device 500 shown in FIGS. 5A and 5B can be a silicon-on-insulator (SOI) isolated well device. As such, the protection device 500 sits in its own "island" of semiconductor material, which is formed in a well of insulation and is insulated from devices outside the well on the same monolithic integrated circuit. In the illustrated embodiment, a handle wafer 501 acts as a carrier substrate and has a buried oxide layer 502 formed of silicon dioxide on the handle wafer 501.

The protection device 500 can also include trench side walls 503a-503d, an N buried layer 510, an N epitaxial layer 520, an N plug 530, an N+ emitter region 540, a P+ region 545, a P base region 550, an N+ collector region 560, an emitter/base contact 571, a collector contact 573, and an insulating layer 580. Details of the components of the protection device 500 can be as described above with respect to those of the protection device 400 of FIGS. 4A and 4B except for the N+ emitter region 540, the P+ region 545, the emitter/base contact 571.

In one embodiment, the components of the protection device 500 can be formed by a bipolar process or a BiCMOS process simultaneously with other bipolar devices on, for example, a monolithic substrate. In another embodiment, the protection device 500 can be formed as a separate device that is not integrated with the internal circuit 103 that is to be protected.

The emitter region 540 contains an n-type dopant, forming an n+ region, and is formed in a shallow trench shape. The emitter region 540 can also be referred to as a "first n-region" in the illustrated embodiment. The emitter region 540 has a first side surface 541a contacting the P+ region 545. The emitter region 540 also includes second side surfaces 541b and a bottom surface 541c contacting the base region 550 while having a top surface exposed above through an opening in the insulating layer 580. The emitter region 540 has a generally rectangular shape when viewed from above. A portion of the emitter/base contact 571 is formed on at least a portion of the top surface of the emitter region 540. The emitter/base contact 571 can serve as the second terminal T2 of the protection device PD of FIG. 2.

The emitter region 540 can have a lateral dimension or width $W_E$ which extends parallel to the side walls 503c, 503d, as denoted in FIG. 5A.

The P+ region 545 contains a p-type dopant, forming a p+ region, and is formed in a shallow trench shape. In the context of this document, the P+ regions 545 can also be referred to as a "barrier region," "P+ barrier region," "current barrier region," "blocking region," or "current blocking region." The P+ region 545 has a first side surface 546a contacting the first side surface 541a of the emitter region 540. The P+ region 545 also includes second side surfaces 546b and a bottom surface 546c contacting the P base region 550 while having a top surface exposed above through the opening in the insulating layer 580. The P+ region 545 has a generally rectangular shape when viewed from above. Another portion of the emitter/base contact 571 is formed on at least a portion of the top surface of the P+ region 545, shorting the emitter region 540 and the P+ region 545 to each other. In one embodiment, a first distance D1 between the P+ region 545 and the N+ collector region 560 can be between about 10 μm and 100 μm. In another embodiment, an array of separate emitter/base contacts can be formed in place of the single emitter/base contact 571 of FIG. 5A. Each of such separate emitter/base contacts can be formed on portions of the emitter region 540 and the P+ region 545, thereby shorting the emitter region 540 and the P+ region 545.

The P+ region 545 can have a lateral dimension or width $W_P$ which extends parallel to the side walls 503c, 503d, as denoted in FIG. 5A. In one embodiment, the width $W_P$ can be substantially the same as the width $W_E$ of the emitter region 540. In other embodiments, the width $W_P$ can be about 5% to about 100% of the width $W_E$ of the emitter region 540. The width $W_P$ can be optionally between about 10% and 70%, or between about 20% and 50%. In one embodiment, the width $W_P$ of the P+ region 545 can be at least about 0.5 μm. A skilled artisan will appreciate that the widths $W_E$ and $W_P$ can vary widely, depending on the configuration of the ESD device.

The base region 550 contains a p-type dopant in a concentration lower than that of the P+ region 545, thereby forming a p-region, and is formed in a trench shape. The base region 550 can also be referred to as a "first p-region" in the illustrated embodiment. The base region 550 has outer side surfaces 551 and a bottom surface 552 that contact the N epitaxial layer 520. The base region 550 also has inner side surfaces 553 and a first top surface 554 that contact the emitter region 540 and the P+ region 545. The base region 550 further includes a second top surface 555 on which a portion of the insulating layer 580 is formed. The base region 550 can be electrically coupled to the emitter/base contact 571 through the P+ region 545.

During operation, when a voltage difference between the emitter contact 571 and the collector contact 573 (the voltage at the emitter/base contact 571 is lower than the voltage at the collector contact 573) reaches a trigger voltage $V_{T1b}$, a current (positive for holes, and negative for electrons) flows from the collector region 560 to the emitter region 540 through the N plug 530, the N buried layer 510, the N epitaxial layer 520, and the P base region 550 in sequence. The arrows shown in FIG. 5B represent an electron flow corresponding to the current flow (electrons are negatively charged).

Further details of the operation of the protection device 500 are as follows. When a positive ESD event occurs to the protection device 500 (for example, a voltage greater than the trigger voltage $V_{T1b}$ is applied between the collector contact 573 and the emitter/base contact 571), a series of breakdown mechanisms occur in the device 500, which enhance the current sinking capability of the device 500 and limit the voltage that is developed to sink a large amount of transient current. During such a positive ESD event, one mechanism that is triggered is simple impact ionization between the P base region 550 and the collector region 560.

During this initial breakdown, a hole current flows from the breakdown site to the P base region 550, and electrons flow from the same breakdown site through the collector region 560 to the collector contact 573. The emitter region 540 is defined to be in the path of the hole current travelling through the P base region 550.

This pinching of the base region 550 in the current path causes a resistive drop to build up in the base region 550, leads to a forward biasing of the emitter region 540 and the switching on of the protection device 500 in a form of a vertical bipolar device. The foregoing describes a second mechanism that occurs during the ESD event.

After the vertical bipolar device switches on, the device 500 can sink more current because of the high gain of the vertical bipolar device. Using an emitter-base resistance rather than a floating base device (such as in the protection device 400 of FIGS. 4A and 4B) results in lower passive power dissipation for a protection circuit, which can be desirable for input pin protection in high performance, low input current analog applications.

As the ESD event becomes severe, the current, which is now flowing by bipolar action from the emitter region 540 to the collector region 560, attains a sufficiently high density such that a Kirk event is triggered in the N epitaxial layer 520. A "Kirk" event refers to an event that occurs at high current densities of a current passing through the base-collection region of a bipolar transistor, and causes a dramatic increase in the transit time of the bipolar transistor. The Kirk event allows the voltage to collapse as large ESD events are dealt with, thus preventing an internal circuit from being exposed to large voltages during the event, which would otherwise damage the internal circuit.

During this Kirk breakdown mechanism, the spacing of the emitter region 540 from the N plug region 530 can establish the ESD rating of the protection device 500. In one embodiment, the spacing between the emitter region 540 and the N plug region 530 can be greater than a vertical distance between the P base 550 and the N buried layer 510, which prevents a localized bipolar action in the lateral direction at the side of the emitter region (as in the protection device 400 of FIGS. 4A and 4B).

By directing the current flow through the bottom surface of the emitter region 540, the P+ region 545 keeps the localized current densities high, and prevents damage that can result from localized heating at a much higher voltage than it otherwise would. Thus, the configuration of the protection device 500 can provide a high ESD rated device.

The protection device 500 can have operating characteristics as shown in FIG. 6B. In the illustrated embodiment, the trigger voltage $V_{T1b}$ of the protection device 500 is about 100 V while the holding voltage $V_{H1b}$ of the protection device is above 36 V. When the voltage across the protection device reaches the holding voltage $V_{H1b}$, the current flow increases with a substantially less change to the voltage across the protection device 500 (see the region 610b in FIG. 6B) than the change of the voltage in the region 610a of FIG. 6A. FIG. 6B also shows that there is a leakage current in a region 620a above about 3 A when a pulsed signal is applied to the protection device 500. Thus, the protection device 500 can operate without breakdown at or below 3 A, and has substantially greater ESD capability than the device 400 (see FIG. 6A).

As described above in connection with FIG. 3, from the holding voltage $V_H$, ideally a current flow can increase without increasing the voltage across the protection device PD. Thus, the protection device 500 of FIGS. 5A and 5B has more ideal characteristics than those of the protection device 400 of FIGS. 4A and 4B. Further, as the protection device 500 can take more current than the protection device 400 (as shown in FIGS. 6A and 6B), the protection device 500 has greater ESD protection over an internal circuit than the protection device 400.

Further, Applicants recognized that the trigger voltage $V_{T1b}$ of the protection device 500 can be adjusted by configuring a second distance D2 between the P base 550 and the N plug region 530. For example, the trigger voltage $V_{T1b}$ of the protection device 500 can be increased by increasing the second distance D2. In one embodiment, the second distance D2 between the P base 550 and N plug region 530 can be between about 10 μm and about 20 μm, for example, about 15 μm. The trigger voltage $V_{T1b}$ of the protection device 500 can also be adjusted by adjusting a vertical distance between the N+ emitter 540 and the N buried layer 510, which may require a change to the manufacturing process. Further, the ESD performance of the device 500 can be enhanced by increasing the horizontal area of the emitter region 540, for example, by increasing the length $L_E$ of the emitter region 540 (FIG. 5A). The length $L_E$ is a dimension perpendicular to the width $W_E$.

Applicants also recognized that the holding voltage $V_{H1b}$ of the protection device 500 can be adjusted by changing the concentration of p-type dopant in the P+ region 545. For example, the holding voltage $V_{H1b}$ of the protection device 500 can be increased by increasing the concentration of p-type dopant in the P+ region 545.

Referring to FIGS. 5C and 5D, in another embodiment, the base/emitter contact 571 of FIGS. 5A and 5B can be replaced with an emitter contact 571' which resides only on the emitter region 540, but not on the P+ region 545. Other details of the device can be as described above in connection with FIGS. 5A and 5B. In another embodiment, an array of separate emitter contacts can be formed in place of the single emitter contact 571' of FIG. 5A.

ESD Protection Device with a Collector Ring

Figure 7A:
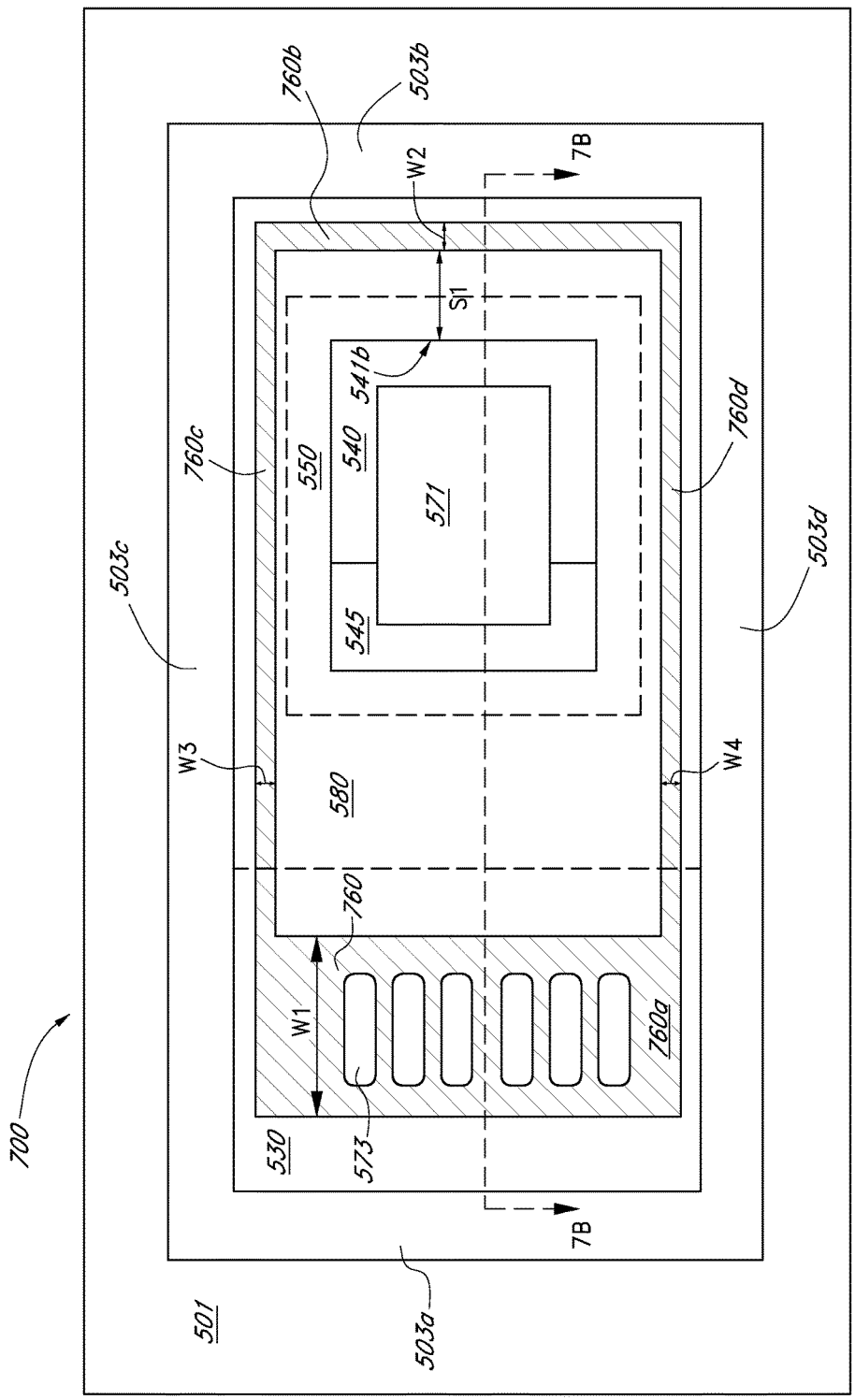
FIG. 7A is a schematic top plan view of a bipolar ESD protection device having a collector ring according to another embodiment.
Figure 7B:
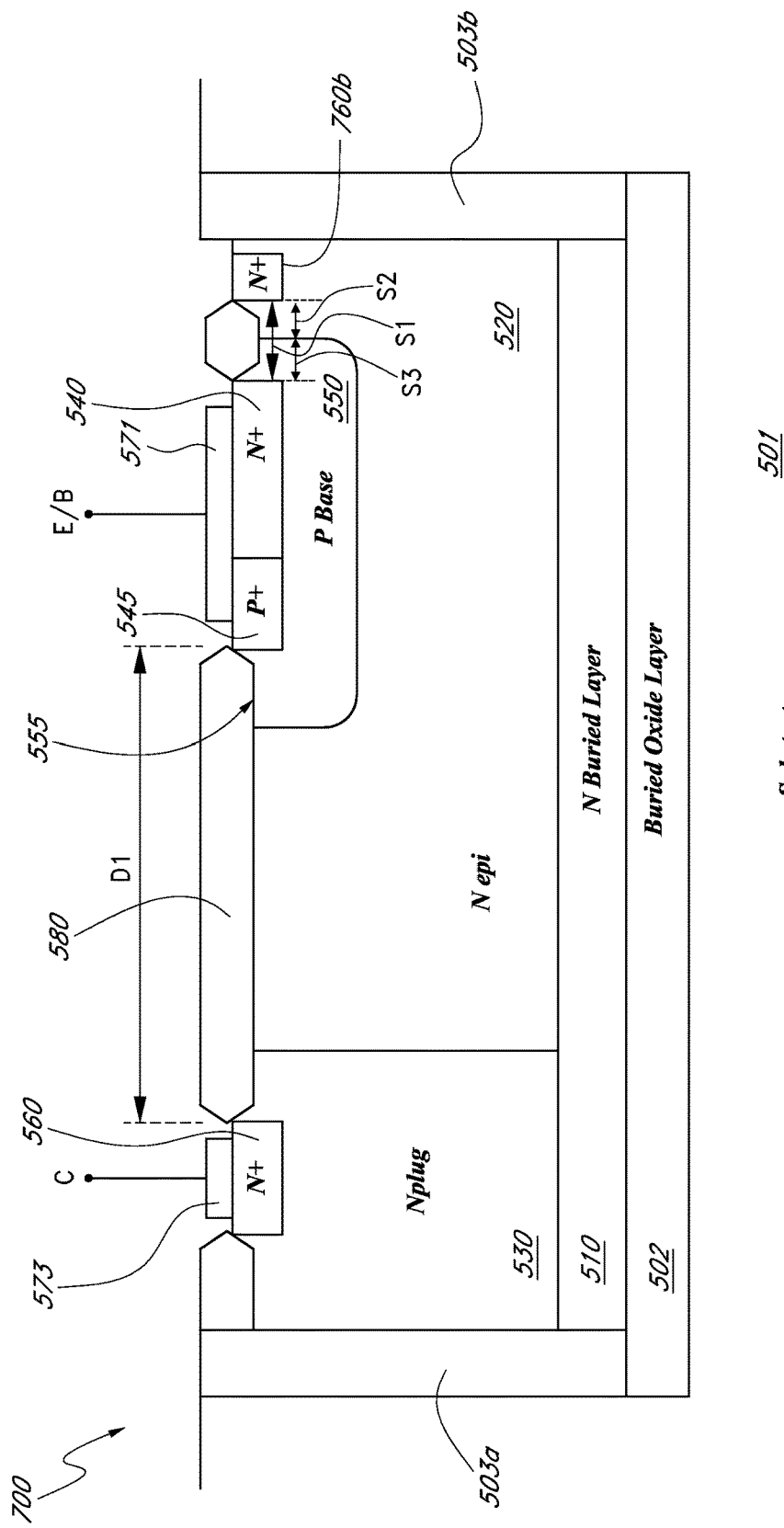
FIG. 7B is a cross-section of the device of FIG. 7A, taken along the line 7B-7B.

Referring to FIGS. 7A and 7B, a bipolar ESD protection device according to another embodiment will be described below. FIG. 7A is a schematic top plan view of the protection device, and FIG. 7B is a cross-section of the protection device, taken along the line 7B-7B. The illustrated protection device 700 can form, for example, the protection device PD of FIG. 2.

The protection device 700 shown in FIGS. 7A and 7B can be a silicon-on-insulator (SOI) isolated well device formed in a handle wafer 501. The protection device 700 can also include a buried oxide layer 502, first to fourth side walls 503a-503d, an N buried layer 510, an N epitaxial layer 520, an N plug 530, an N+ emitter region 540, a P+ region 545, a P base region 550, an N+ collector ring 760, an emitter/base contact 571, a collector contact 573, and an insulating layer 580. Details of the components of the protection device 700 can be as described above with respect to those of the protection device 500 of FIGS. 5A and 5B except for the collector ring 760. In one embodiment, the components of the protection device 700 can be formed by a bipolar process or a BiCMOS process.

The collector ring 760 contains an n-type dopant, forming an n+ region, and is formed in a generally rectangular ring shape when viewed from above the device 700, as shown in FIG. 7A. It will be understood that edges of a generally rectangular shape can become rounded during processing. In one embodiment, the collector ring 760 is heavily doped with an n-type dopant. The collector ring 760 can have first to fourth portions 760a-760d that can together laterally surround a portion of the N plug 530, a substantial portion of the N epitaxial layer 520, the emitter region 540, the P+ region 545, and the P base region 550.

When viewed from above the device 700, the first side wall 503a is on the left, and extends vertically in FIG. 7A; the second side wall 503b is on the right, and extends vertically in FIG. 7A; the third side wall 503c is on the top, and extends horizontally in FIG. 7A; and the fourth side wall 503d is on the bottom, and extends horizontally in FIG. 7A.

When viewed from above, the first portion 760a is formed in the middle of the N plug 530, and extends in parallel to the first side wall 503a with its opposing end portions having gaps with the third and fourth side walls 503c, 503d. The second portion 760b is formed in the N epitaxial layer 520 proximate to the second side wall 503b, and extends in parallel to the second side wall 503b while having a gap with the second side wall 503b and the P base region 550.

The second portion 760b can have a first spacing S1 (alternatively, a gap or distance) with the opposing edge of the emitter region 540, and a second spacing S2 with the opposing edge of the P base region 550, as shown in FIGS. 7A and 7B. A third spacing which is equal to S1-S2 is denoted as S3 in FIG. 7B. In one embodiment, the second spacing S2 can be between about 1 μm and about 4 μm, for example, about 2 μm. The third spacing S3 can be between about 1 μm and about 7 μm, for example, about 2 μm.

The third portion 760c is formed in a portion of the N plug 530 and a portion of the N epitaxial layer 520 proximate to the third side wall 503c, and extends in parallel to the third side wall 503c while having a gap with the third side wall 503c and the P base region 550. The fourth portion 760d is formed in a portion of the N plug 530 and a portion of the N epitaxial layer 520 proximate to the fourth side wall 503d, and extends in parallel to the fourth side wall 503d while having a gap with the fourth side wall 503d and the P base region 550.

As shown in FIG. 7B, the first and second portions 760a, 760b of the collector ring 760 are formed in a shallow trench shape, and the third and fourth portions 760c, 760d of the collector ring 760 have substantially the same depth as the first and second portions 760a, 760b. The first to fourth portions 760a-760d can have widths W1-W4, respectively, that can vary widely, depending on the design of the device 700 while the first portion 760a can have the greatest width.

The collector ring 760, by having the second portion 760b close to the emitter region 540, can facilitate triggering the initial breakdown. Further, by reducing the spacing S1 between the second portion 760b and the emitter region 540, the initial breakdown can be triggered at a lower voltage. During the initial breakdown, a current can flow from the second portion 760b to the emitter region 540. Once the initial breakdown is completed (when a forward bias voltage drop is established between the base and emitter regions 550, 540), the device 700 operates as a vertical device similar to that shown in FIG. 5B. In addition, the trigger voltage of the device 700 can be easily tuned by selecting the spacing between the second portion 760b and the emitter region 540. In one embodiment, the trigger voltage of the device 700 can be decreased by reducing the second spacing S2. In another embodiment, the trigger voltage of the device 700 can be decreased by reducing the third spacing S3, to an extent that a vertical current flow from the emitter region 540 is not interfered with. Other details of the operation of the protection device 700 can be as described above with respect to FIGS. 5A and 5B. The device 700 can have a lower trigger voltage than that of the device 500 of FIGS. 5A and 5B.

Bidirectional ESD Protection Device

Figure 8A:
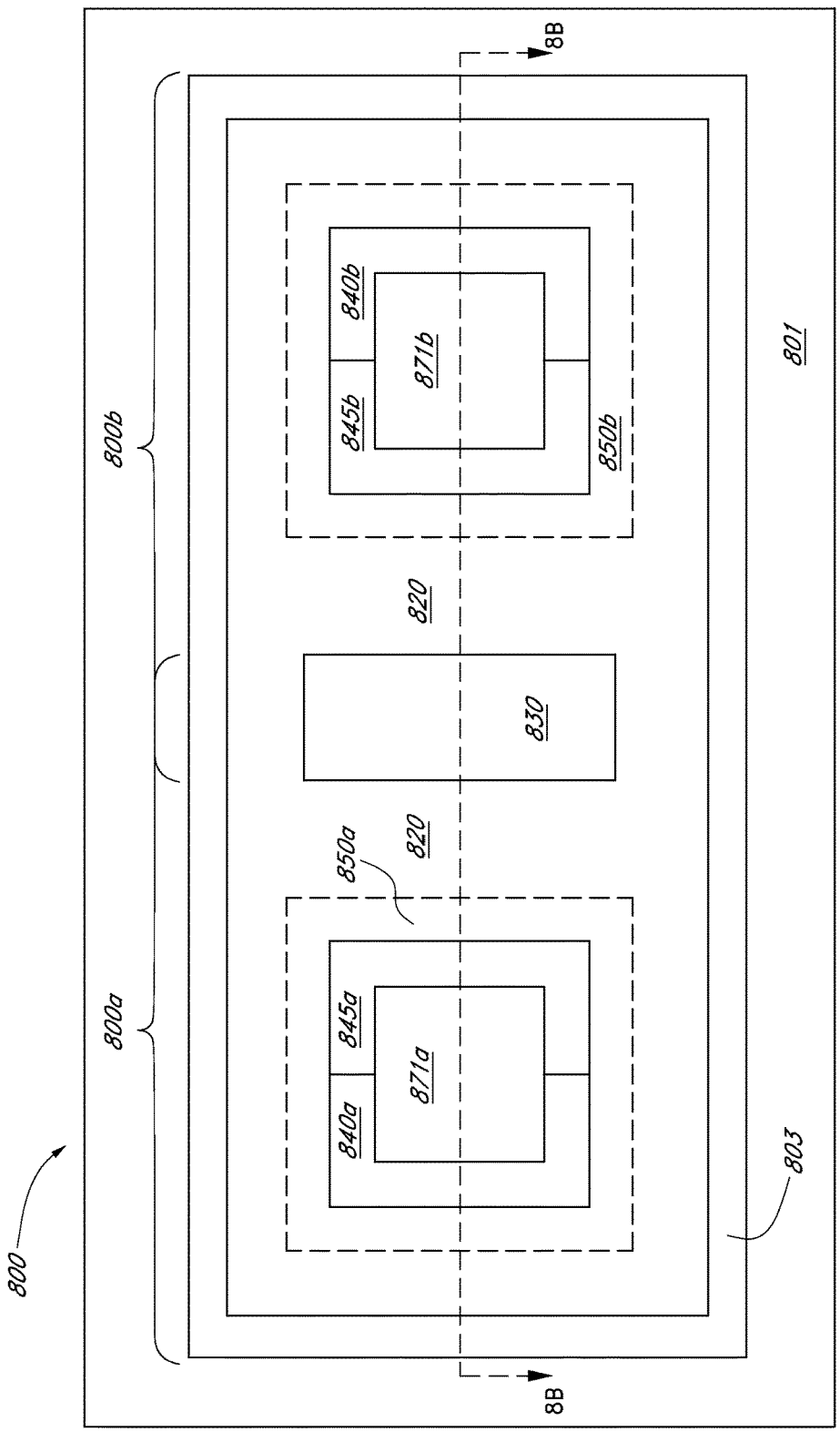
FIG. 8A is a schematic top plan view of a bi-directional bipolar ESD protection device according to yet another embodiment.
Figure 8B:
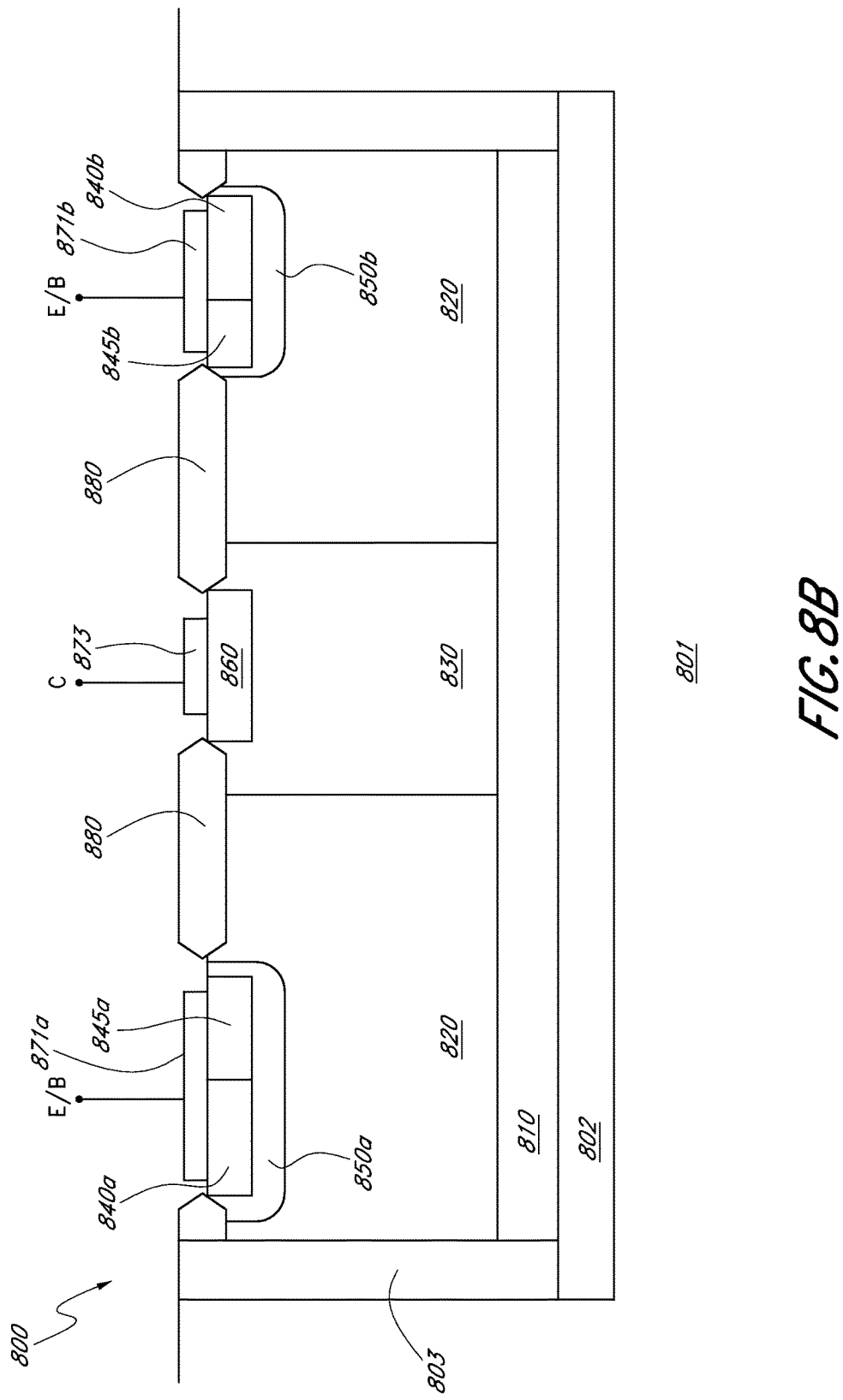
FIG. 8B is a cross-section of the device of FIG. 8A, taken along the line 8B-8B.

Referring to FIGS. 8A and 8B, a bi-directional bipolar ESD protection device according to another embodiment will be described below. FIG. 8A is a schematic top plan view of the protection device, and FIG. 8B is a cross-section of the protection device, taken along the line 8B-8B.

The protection device 800 shown in FIGS. 8A and 8B can be a silicon-on-insulator (SOI) isolated well device formed a handle wafer 801. The protection device 800 can include a buried oxide layer 802, and side walls 803. The protection device 800 includes a first portion 800a and a second portion 800b within a space enclosed by the buried oxide layer 802 and the side walls 803.

The protection device 800 can also include an N buried layer 810, an N epitaxial layer 820, an N plug 830, first and second N+ emitter regions 840a, 840b, first and second P+ regions 845a, 845b, first and second P base regions 850a, 850b, a collector region 860, first and second emitter/base contacts 871a, 871b, a collector contact 873, and an insulating layer 880. The components of the device can be arranged symmetrically with respect to the N plug 830, and the collector region 860.

The first portion 800a can include the left portions of the N buried layer 810 and the N epitaxial layer 820, the N plug 830, the first N+ emitter region 840a, the first P+ region 845a, the first P base region 850a, the collector region 860, the first emitter/base contact 871a, the collector contact 873, and the left portion of the insulating layer 880. The second portion 800b can include the right portions of the N buried layer 810 and the N epitaxial layer 820, the N plug 830, the second N+ emitter region 840b, the second P+ region 845b, the second P base region 850b, the collector region 860, the second emitter/base contact 871b, the collector contact 873, and the right portion of the insulating layer 880. Other details of the components of the first and second portions 800a, 800b can be as described above with respect to those of the protection device 500 of FIGS. 5A and 5B.

In one embodiment, the illustrated protection device 800 can form, for example, at least part or the whole of the first and fourth protection circuits 110, 140 of FIG. 1A or the third and fifth protection circuits 130, 150 of FIG. 1A. In such an embodiment, the collector contact 873 can be electrically coupled to an input or output node 163, 164. The first emitter/base contact 871a can be electrically coupled to the first power supply rail 101, and the second emitter/base contact 871b can be electrically coupled to the second power supply rail 102.

During operation, the first and second portions 800a, 800b can operate at different triggering conditions. For example, the first portion 800a can protect an internal device from an overvoltage condition while the second portion 800b can protect the internal device from an undervoltage condition, or vice versa, by turning on either of the first or second portion 800a, 800b. Other details of the operation of each portion 800a, 800b of the protection device 800 can be as described above with respect to FIGS. 5A and 5B.

In another embodiment, the first and second portions 800a, 800b can have different dimensions and/or concentrations in the P+ regions 845a, 845b such that the portions 800a, 800b have different triggering voltages and/or holding voltage. In yet another embodiment, one or more of the first and second portions 800a, 800b can include a collector ring, as described above in connection with FIGS. 7A and 7B.

ESD Protection Device with an External Resistor

Referring to FIG. 9, a bipolar ESD protection device according to yet another embodiment will be described below. The illustrated protection device 900 can form, for example, the protection device PD of FIG. 2.

The protection device 900 can include a silicon-on-insulator (SOI) isolated well device 900a formed in a handle wafer 501. The SOI isolated well device 900a can include a buried oxide layer (not shown in FIG. 9, but see the buried oxide layer 502 in FIG. 5B), side walls 503, an N buried layer (not shown in FIG. 9, but see the N buried layer 510 in FIG. 5B), an N epitaxial layer 520, an N plug 530, an N+ emitter region 540, a P+ region 545, a P base region 550, an N+ collector region 560, a first (or emitter) contact 971a, a second (or base) contact 971b, a collector contact 573, and an insulating layer (not shown in FIG. 9, but see 580 in FIG. 5B). The protection device 900 can further include a resistor 990, a first interconnect 980a, and a second interconnect 980b. Details of the components of the protection device 900 can be as described above with respect to those of the protection device 500 of FIGS. 5A and 5B except for the first and second contacts 971a, 971b, the resistor 990, the first interconnect 980a, and the second interconnect 980b. In one embodiment, the components of the protection device 900 can be formed by a bipolar process or a BiCMOS process.

Unlike the emitter/base contact 571 of FIG. 5A, the first and second contacts 971a, 971b are separate, and contacted by the emitter region 540 and the P+ region 545, respectively. The resistor 990 can be formed outside the SOI isolated well device 900a. One end of the resistor 990 is electrically coupled to the first contact 971a via the first interconnect 980a, and the other end of the resistor 990 is electrically coupled to the second contact 971b via the second interconnect 980b. The first contact 971a can be electrically coupled to a node of an internal circuit, for example, the second node N2 of FIG. 2. The resistor 990 may be in a form of thin film resistor.

The resistor 990 can serve as a switch to flow small currents therethrough. By having the resistor 990, a relatively large breakdown current (and consequently collector voltage) is not required to switch on the SOI-isolated well device 900a, and snapback. Thus, the protection device 900 can be held near the breakdown voltage of the collector to the emitter with the base shorted to the emitter (in the device shown in FIGS. 5A and 5B), and can have a lower trigger voltage than that of the device 500 of FIGS. 5A and 5B.

In another embodiment, the protection device can include a collector ring as described above in connection with FIGS. 7A and 7B. In yet another embodiment, the protection device 900 can be implemented as a bi-directional device, as described above in connection with FIGS. 8A and 8B.

Applications

Thus, a skilled artisan will appreciate that the configurations and principles of the embodiments can be adapted for any devices that can be protected from over- or under-voltage conditions by the ESD protection devices described above. The ESD protection devices employing the above described configurations can be implemented into various electronic devices or integrated circuits. Examples of the electronic devices can include, but are not limited to, consumer electronic products, parts of the consumer electronic products, electronic test equipments, etc. Examples of the electronic devices can also include circuits of optical networks or other communication networks, and disk driver circuits. The consumer electronic products can include, but are not limited to, a mobile phone, cellular base stations, a telephone, a television, a computer monitor, a computer, a hand-held computer, a netbook, a tablet computer, a digital book, a personal digital assistant (PDA), a stereo system, a cassette recorder or player, a DVD player, a CD player, a VCR, a DVR, an MP3 player, a radio, a camcorder, a camera, a digital camera, a portable memory chip, a copier, a facsimile machine, a scanner, a multi functional peripheral device, a wrist watch, a clock, etc. Further, the electronic device can include unfinished products.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus for electrostatic discharge (ESD) protection, the apparatus comprising:
    an ESD protection device configured to protect a circuit from overvoltage and/or undervoltage conditions, wherein the protection device comprises:
        an emitter region having a first diffusion polarity, the emitter region having a bottom surface on a side opposite to an emitter/base contact for the emitter region;
        a collector region laterally spaced apart from the emitter region, the collector region having the first diffusion polarity;
        a barrier region interposed laterally between the emitter region and the collector region, the barrier region laterally contacting at least a portion of the emitter region such that current flow through the emitter region is directed through the bottom surface of the emitter region, the barrier region having a second diffusion polarity opposite from the first diffusion polarity; and
        a base region having the second diffusion polarity, the base region laterally surrounding and underlying an outer edge of the emitter region and the barrier region, wherein the barrier region has a higher dopant concentration than the base region.

2. The apparatus of claim 1, wherein the barrier region substantially covers a side surface of the emitter region that faces the collector region.

3. The apparatus of claim 1, wherein the first diffusion polarity is n-type, and wherein the second diffusion polarity is p-type.

4. The apparatus of claim 3, wherein the protection device further comprises:
    an N buried layer disposed over a substrate;
    an N epitaxial layer disposed on a first portion of the N buried layer, wherein the emitter region, the barrier region, and the base region are disposed in a top portion of the N epitaxial layer; and
    an N plug disposed on a second portion of the N buried layer while laterally contacting the N epitaxial layer, wherein the collector region is disposed in a top portion of the N plug.

5. The apparatus of claim 4, wherein the protection device further comprises:
    a buried oxide layer disposed between the substrate and the N buried layer; and
    trench sidewalls laterally surrounding the N buried layer, the N epitaxial layer, and the N plug,
    wherein the buried oxide layer and the trench sidewalls form a well of isolation.

6. The apparatus of claim 1, wherein the protection device further comprises a metal contact disposed on the emitter region and the barrier region.

7. The apparatus of claim 1, wherein the protection device further comprises a metal contact disposed on the emitter region without contacting the barrier region.

8. The apparatus of claim 1, wherein the protection device further comprises a collector ring which comprises the collector region and portions extending laterally from the collector region to form an annular shape laterally surrounding the emitter region, the base region, and the barrier region.

9. The apparatus of claim 1, wherein the protection device further comprises:
    a first contact disposed on the emitter region;
    a second contact separate from the first contact and disposed on the barrier region; and
    a resistor electrically coupled between the first and second contacts.

10. The apparatus of claim 1, wherein the protection device further comprises:
    another emitter region having the first diffusion polarity, the other emitter-region positioned on the opposite side of the collector region from the emitter region;
    another barrier region interposed laterally between the other emitter region and the collector region, the other barrier region laterally contacting at least a portion of the other emitter region, the other barrier region having the second diffusion polarity; and
    another base region having the second diffusion polarity, the other base region laterally surrounding and underlying the other emitter region and the other barrier region, wherein the other barrier region has a higher dopant concentration than the other base region.

11. The apparatus of claim 10, wherein the protection device further comprises:
    a buried oxide layer disposed on a substrate;
    an N buried layer disposed over the buried oxide layer;
    an N epitaxial layer comprising a first portion disposed on a first region of the N buried layer, and a second portion disposed on a second region of the N buried layer, wherein the emitter region, the barrier region, and the base region are disposed in a top portion of the first portion of the N epitaxial layer, wherein the other emitter region, the other barrier region, and the other base region are disposed in a top portion of the second portion of the N epitaxial layer;

an N plug disposed on a third region of the N buried layer between the first and second portions of the N epitaxial layer while laterally contacting the first and second portions of the N epitaxial layer, wherein the collector region is disposed in a top portion of the N plug; and sidewalls laterally surrounding the N buried layer, the N epitaxial layer, and the N plug.

12. The apparatus of claim 1, further comprising a diode having an anode electrically coupled to the emitter region and a cathode electrically coupled to the collector region.

13. The apparatus of claim 1, further comprising an internal circuit electrically coupled to a first power supply rail, a second power supply rail, an input node, and an output node, wherein the second power supply rail is configured to provide a higher supply voltage than the first power supply rail.

14. The apparatus of claim 13, wherein the internal circuit and the protection circuit are part of an integrated circuit.

15. The apparatus of claim 13, wherein the collector region of the protection device is electrically coupled to the first power supply rail, wherein the emitter region of the protection device is electrically coupled to the second power supply rail, the input node, or the output node.

16. The apparatus of claim 13, wherein the collector region of the protection device is electrically coupled to the input node; and wherein the emitter region of the protection device is electrically coupled to the second power supply rail.

17. The apparatus of claim 13, wherein the collector region of the protection device is electrically coupled to the output node; and wherein the emitter region of the protection device is electrically coupled to the second power supply rail.

18. The apparatus of claim 13, further comprising an electrostatic discharge (ESD) diode having an anode electrically coupled to the input or output node, and a cathode electrically coupled to the first power supply rail.

19. An electronic device that includes electrostatic discharge (ESD) protection, the electronic device comprising:

an internal circuit electrically coupled to a first power supply rail, a second power supply rail, an input node, and an output node; and a bipolar device electrically coupled to one or more of the first power supply rail, the second power supply rail, the input node, or the output node, wherein the bipolar device comprises:

an emitter region having a first diffusion polarity, the emitter region having a bottom surface on a side opposite to an emitter/base contact for the emitter region;

a collector region laterally spaced apart from the emitter region, the collector region having the first diffusion polarity; and a barrier region interposed laterally between the emitter region and the collector region, the barrier region laterally contacting at least a portion of the emitter region such that current flow through the emitter region is directed through the bottom surface of the emitter region during an ESD event, the barrier region having a second diffusion polarity opposite from the first diffusion polarity; and a base region having the second diffusion polarity, the base region laterally surrounding and underlying an outer edge of the emitter region and the barrier region, wherein the barrier region has a higher dopant concentration than the base region.

20. The electronic device of claim 19, wherein the bipolar device further comprises:

an N buried layer disposed over a substrate;

an N epitaxial layer disposed on a first portion of the N buried layer, wherein the emitter region, the barrier region, and the base region are disposed in a top portion of the N epitaxial layer; and an N plug disposed on a second portion of the N buried layer while laterally contacting the N epitaxial layer, wherein the collector region is disposed in a top portion of the N plug.

21. The electronic device of claim 19, further comprising a diode having an anode electrically coupled to the emitter region, and a cathode electrically coupled to the collector region.

22. A method of forming a semiconductor device that includes electrostatic discharge (ESD) protection, the method comprising:

forming a bipolar protection device comprising:

an emitter region having a first diffusion polarity, the emitter region having a bottom surface on a side opposite to an emitter/base contact for the emitter region;

a collector region laterally spaced apart from the emitter region, the collector region having the first diffusion polarity;

a barrier region interposed laterally between the emitter region and the collector region, the barrier region laterally contacting at least a portion of the emitter region such that current flow through the emitter region is directed through the bottom surface of the emitter region, the barrier region having a second diffusion polarity opposite from the first diffusion polarity; and a base region having the second diffusion polarity, the base region laterally surrounding and underlying an outer edge of the emitter region and the barrier region, wherein the barrier region has a higher dopant concentration than the base region; and forming an internal circuit electrically coupled to the protection device.

23. The method of claim 22, wherein forming the protection device further comprises selecting a distance between the base region and the collector region to set the trigger voltage of the protection device.

24. The method of claim 22, wherein forming the protection device further comprises forming a collector ring which comprises the collector region and portions extending laterally from the collector region to form an annular shape laterally surrounding the emitter region, the base region, and the barrier region, wherein forming the collector ring comprises selecting a spacing between the base region and one of the portions of the collector ring to set the trigger voltage of the protection device.

25. The method of claim 24, wherein the one of the portions of the collector ring is on the opposite side of the base region from the collector region.

26. The apparatus of claim 1, wherein the entire first emitter surface directly contacts the entire first barrier side surface.

* * * * *